(12) United States Patent
Yeom

(10) Patent No.: US 8,674,420 B2
(45) Date of Patent: Mar. 18, 2014

(54) SEMICONDUCTOR DEVICES INCLUDING BURIED GATE ELECTRODES AND METHODS OF FORMING SEMICONDUCTOR DEVICES INCLUDING BURIED GATE ELECTRODES

(75) Inventor: Kye-Hee Yeom, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1160 days.

(21) Appl. No.: 12/588,111

(22) Filed: Oct. 5, 2009

(65) Prior Publication Data

US 2010/0085800 A1     Apr. 8, 2010

(30) Foreign Application Priority Data

Oct. 6, 2008  (KR) .................. 10-2008-0097615

(51) Int. Cl.
  *H01L 21/8242* (2006.01)
  *H01L 27/108* (2006.01)
(52) U.S. Cl.
  USPC ............... 257/296; 257/330; 257/E21.657; 257/E27.088; 257/E29.13; 438/239; 438/270; 438/282
(58) Field of Classification Search
  USPC ............ 257/296, 330, E27.084, E27.088, 257/E29.13, E21.646, E21.656, E21.657; 438/239, 270, 272, 282
  See application file for complete search history.

(56) References Cited

U.S. PATENT DOCUMENTS

| 6,770,535 | B2  |   | 8/2004  | Yamada et al.  |         |
|-----------|-----|---|---------|----------------|---------|
| 6,774,016 | B2  | * | 8/2004  | Jang ............... | 438/480 |
| 7,378,707 | B2  | * | 5/2008  | Bhattacharyya ........... | 257/328 |
| 7,759,704 | B2  | * | 7/2010  | Popp et al. ............ | 257/208 |
| 2007/0284647 | A1 | * | 12/2007 | Seo et al. ............. | 257/315 |
| 2008/0121961 | A1 | * | 5/2008  | Schloesser ............ | 257/302 |

FOREIGN PATENT DOCUMENTS

JP      2002-353334 A   12/2002
KR   10-2005-0049635 A    5/2005

* cited by examiner

*Primary Examiner* — Allison P Bernstein
(74) *Attorney, Agent, or Firm* — Lee & Morse, P.C.

(57) ABSTRACT

A semiconductor device, including a semiconductor substrate including isolations defining active regions of the semiconductor substrate, a plurality of buried gate electrodes extending below an upper surface of the semiconductor device, and a plurality of bit lines extending along a first direction over the semiconductor substrate, wherein the plurality of bit lines are connected to corresponding ones of the active regions of the semiconductor substrate, and at least a portion of the bit lines extend along a same and/or substantially same plane as an upper surface of the corresponding active region to which it is connected.

22 Claims, 24 Drawing Sheets

SEMICONDUCTOR DEVICES INCLUDING BURIED GATE ELECTRODES AND METHODS OF FORMING SEMICONDUCTOR DEVICES INCLUDING BURIED GATE ELECTRODES

BACKGROUND

1. Field

Embodiments relate to buried channel array transistor (BCAT) devices and methods of forming BCAT devices. More particularly, embodiments relate to a BCAT device that has a shorter height and/or reduced loading capacitance than conventional devices.

2. Description of the Related Art

As semiconductor devices are becoming more and more integrated, device characteristics may suffer. For example, threshold voltages of devices, e.g., transistors, may be lowered. Refresh characteristics may also be degraded as channel lengths of transistors are shortened. Buried channels may be employed to help alleviate, e.g., such problems. More particularly, in a memory device, e.g., dynamic random access memory (DRAM) including BCATs, cell bit lines may be arranged above a substrate. Thus, e.g., a loading capacitance of the bit lines may be relatively high, a height of the bit line relative to the substrate may be high and/or an overall height of the DRAM as a result of, e.g., the bit lines may be tall.

SUMMARY

Embodiments are therefore directed to semiconductor devices and methods of fabricating semiconductor devices, which substantially overcome one or more of the problems due to the limitations and disadvantages of the related art.

It is therefore a feature of an embodiment to provide semiconductor devices, e.g., DRAM device, including a BCAT and having a conductive pattern, e.g., a bit line, closer to a semiconductor substrate than conventional devices.

It is therefore a feature of an embodiment to provide semiconductor devices, e.g., DRAM device, including a BCAT and having a conductive pattern, e.g., a bit line, arranged directly on a semiconductor substrate and/or directly connected to an active area of the semiconductor substrate, e.g., source/drain of the BCAT.

It is therefore a separate feature of an embodiment to provide semiconductor devices, e.g., DRAM device, including a BCAT and having a lower bit line loading capacitance relative to conventional devices.

It is therefore a feature of an embodiment to provide semiconductor devices that include a BCAT and have a shorter height than conventional devices.

It is therefore a separate feature of an embodiment to provide methods of forming semiconductor devices in which node margins of buried contact areas are improved.

It is therefore a separate feature of an embodiment to provide methods of forming semiconductor devices requiring fewer fabrication steps, e.g., fewer photoresist steps.

At least one of the above and other features and advantages may be realized by providing a semiconductor device, including a semiconductor substrate including isolations defining active regions of the semiconductor substrate, a plurality of buried gate electrodes extending below an upper surface of the semiconductor device, and a plurality of bit lines extending along a first direction over the semiconductor substrate, wherein the plurality of bit lines are connected to corresponding ones of the active regions of the semiconductor substrate, and at least a portion of the bit lines extend along a same and/or substantially same plane as an upper surface of the corresponding active region to which it is connected.

At least a portion of the bit lines may extend along a same plane as the upper surface of the corresponding active region to which it is connected.

At least one of the bit lines and/or the active regions may include protruding portions that protrude in a second direction crossing the first direction so as to directly overlap with and connect to the other of the other corresponding one of the active regions and bit lines, respectively.

The bit lines have a substantially and/or a completely line type pattern.

The bit lines may be connected to the corresponding active regions via conductive patterns directly over the active region, sidewalls of the conductive patterns being directly connected to the corresponding bit lines, the sidewalls of the conductive patterns extending along a third direction substantially perpendicular to a plane along which the semiconductor substrate extends.

The device may include a plurality of capacitors on the semiconductor substrate, and a plurality of buried contacts electrically connecting corresponding ones of the active regions of the semiconductor substrate to a corresponding one of the capacitors.

The plurality of buried contacts may be on a same and/or substantially same level as the bit lines relative to an upper surface of the semiconductor substrate.

The device may include a capping layer extending over the bit lines.

The active regions may be substantially arranged between adjacent ones of the bit lines.

The bit lines may be formed directly on the semiconductor substrate.

At least one of the above and other features and advantages may be separately realized by providing a method of forming a semiconductor device, including forming isolations defining active regions of a semiconductor substrate, forming a plurality of buried gate electrodes extending below an upper surface of the semiconductor device, and forming a plurality of bit lines extending along a first direction over the semiconductor substrate, wherein the plurality of bit lines are connected to corresponding ones of the active regions of the semiconductor substrate, and at least a portion of the bit lines extend along a same and/or substantially same plane as an upper surface of the corresponding active region to which it is connected.

Forming the bit lines may include forming the bit lines directly on the semiconductor substrate.

Forming the plurality of bit lines and forming the active regions may include patterning one of the bit lines and the active regions to include protruding portions that protrude in a second direction crossing the first direction so as to directly overlap with and connect to the other corresponding one of the active regions and bit lines, respectively.

The method may include forming conductive patterns directly over the corresponding active region, wherein the bit lines are connected to the corresponding active regions via the conductive patterns and sidewalls of the conductive patterns are directly connected to the corresponding bit lines, the sidewalls of the conductive patterns may extend along a third direction substantially perpendicular to a plane along which the semiconductor substrate extends.

The semiconductor device may include a cell region and a peripheral region, and the method may include simultaneously forming a peripheral conductive pattern on the peripheral region while forming the conductive patterns on the active regions on the cell region.

Forming the conductive patterns may include forming a recess in a portion of the bit lines between adjacent ones of the buried gate electrodes, and arranging at least a portion of a respective one of the conductive patterns in the recess formed in corresponding bit line.

The semiconductor device may include a cell region and a peripheral region, and the method may include forming a peripheral gate electrode in the peripheral region, wherein forming the bit lines and forming the peripheral gate electrode may occur simultaneously.

The method may include forming a plurality of buried contacts on the semiconductor substrate, and forming a plurality of capacitor structures on the semiconductor substrate, the buried contacts may electrically connecting corresponding ones of the active regions of the semiconductor substrate to a corresponding one of the capacitor structures.

Forming the buried contacts may include forming the buried contacts such that the plurality of buried contacts are on a same and/or substantially same level as the bit lines relative to an upper surface of the semiconductor substrate.

The method may include forming a capping layer extending over the bit lines.

The semiconductor device may include a cell region and a peripheral region, and the method may include simultaneously forming a peripheral gate electrode on the peripheral region while forming the bit lines on the cell region.

At least one of the above and other features and advantages may be separately realized by providing a system, including a controller, and a memory device, the memory device including a semiconductor substrate including isolations defining active regions of the semiconductor substrate, a plurality of buried gate electrodes extending below an upper surface of the semiconductor device, and a plurality of bit lines extending along a first direction over the semiconductor substrate, wherein the plurality of bit lines are connected to corresponding ones of the active regions of the semiconductor substrate, and at least a portion of the bit lines extend along a same and/or substantially same plane as an upper surface of the corresponding active region to which it is connected, and wherein the controller is adapted to program data in and erase data from the memory device.

The memory device may be a DRAM flash memory.

BRIEF DESCRIPTION OF THE DRAWINGS

The above and other features and advantages of embodiments will become more apparent to those of ordinary skill in the art by describing in detail exemplary embodiments with reference to the attached drawings, in which.

DETAILED DESCRIPTION

Korean Patent Application No. 2008-0097615, filed on Oct. 6, 2008, in the Korean Intellectual Property Office, and entitled: "A Semiconductor Device With Have Buried Gate Electrode Structure And A Method For Manufacturing The Same," is incorporated by reference herein in its entirety.

Embodiments of one or more aspects of the invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these embodiments are provided so that this disclosure will be thorough and complete, and will fully convey the scope of the invention to those skilled in the art. Further, some elements that are not essential to the complete understanding of the exemplary embodiments and/or are well known may be omitted. For example, when describing a transistor gate structure, a description of a gate oxide layer may be omitted.

Figure 1:
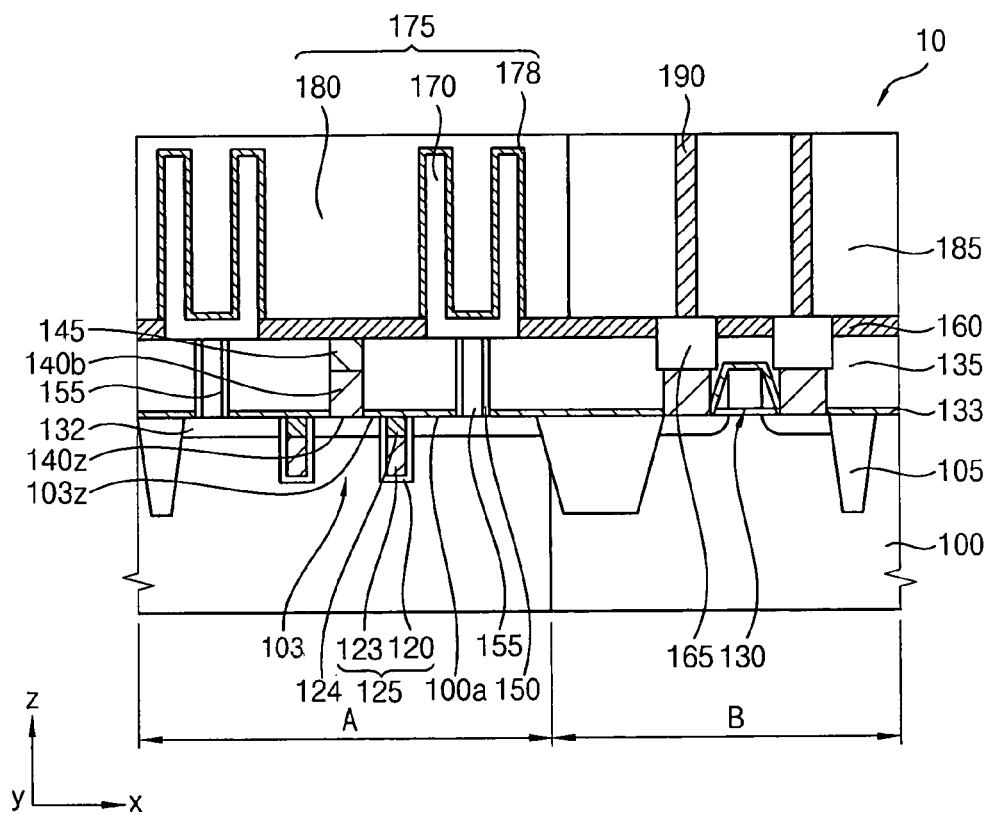
FIG. 1 illustrates a cross-sectional view of an exemplary DRAM device including a BCAT structure according to an exemplary embodiment.

FIG. 1 illustrates a cross-sectional view of an exemplary semiconductor device, e.g., a DRAM device 10 including a BCAT structure according to an exemplary embodiment.

Referring to FIG. 1, the DRAM device 10 may include a semiconductor substrate 100 including a cell region A and a periphery region B. The DRAM device 10 may include an isolation trench 105, a buried gate 125, a gate capping pattern 124, an etch stop layer 133, a first insulating interlayer 135, a first conductive pattern 140, a capping pattern 145, a spacer 150, a second conductive pattern 155, a second etch stop layer 160, a capacitor 175, a peripheral gate electrode 130, a third conductive pattern 165, an insulating layer 185, and metal pattern 190. The buried gate 125 may include a gate electrode 123 and a gate insulation layer 120. The capping pattern 124 may be formed on the gate electrode 123, and sides thereof may be covered by the gate insulation layer 120. Source/drain regions 132 may be defined in the semiconductor substrate 100. The capacitor 175 may include a capacitor first electrode 170, a capacitor dielectric layer 178, and a capacitor second electrode 180.

In the cell region A, at least a portion of the buried gate 125 may be below an upper surface 100a of the semiconductor substrate 100. For example, at least a portion of the buried gate 125 may be within a trench formed in the semiconductor substrate 100. The gate insulating layer 120 may be formed on the semiconductor substrate 100, between the semiconductor substrate 100 and the gate electrode 123 and/or the capping pattern 124, e.g., within a trench formed in the semiconductor substrate 100. An upper surface of the capping pattern 124 may correspond to the upper surface of the semiconductor substrate 100. An upper surface of the gate electrode 123 may be completely below the upper surface of the semiconductor substrate 100. The source/drain regions 132 may correspond to portions of the active region 103 of the semiconductor substrate 100 on sides of the gate electrode 123. More particularly, e.g., the source/drain regions 132 may be formed at an upper portion of the semiconductor substrate 100 on sides of the buried gate 125.

The first conductive pattern 140 may be formed directly on the semiconductor substrate 100. At least a portion of the first conductive pattern 140 may directly overlap the active region 103 and/or at least a portion may extend along a same x-y plane as a portion of the active region 103. For example, a lower surface 140z of the first conductive pattern 140 may completely and/or substantially extend along a same x-y plane as an upper surface 103z of the active region 103. More particularly, e.g., in some embodiments, a portion of the first conductive pattern 140 may be arranged directly on a respective source/drain region 132 corresponding to one or more of the buried gates 125. In such embodiments, e.g., a portion of the first conductive pattern 140 may directly overlap a portion of the respective active area 103 corresponding to the source/drain region 132 between two gate electrodes 123 associated therewith.

Embodiments are not, however, limited to the exemplary embodiment illustrated in FIG. 1. For example, in some embodiments, while the first conductive pattern 140 may be formed directly on the semiconductor substrate 100, the first conductive pattern 140 may not overlap the respective active area 103 and another conductive pattern may be arranged directly on the respective active area 103 of the semiconductor substrate 100 as an extension of the first conductive pattern 140 so as to connect the first conductive pattern 140 to the respective active area 103 of the semiconductor substrate 100. In such cases, while the another conductive pattern and the first conductive pattern 140 may correspond to a same layout level relative to the semiconductor substrate 100 and may include a same material as the first conductive pattern 140, in some embodiments, the another conductive pattern may include one or more different conductive materials than the first conductive pattern 140. More particularly, e.g., in some embodiments, the another conductive pattern may be a result of a separate processing step, i.e., formed before or after the first conductive pattern 140 is formed.

The first conductive pattern 140 may have a line-type pattern. Each of the line-type patterns of the first conductive pattern 140 may have a substantially oval or rectangular shape. The line-type patterns of the first conductive pattern 140 may be arranged parallel to each other so as to form a striped pattern. The active areas 103 may have an island-type pattern. Each of island-type patterns of the active areas 103 may have a substantially oval or rectangular shape. In such embodiments, the lines of the first conductive pattern 140 and the islands of the active areas 103 may extend along a first direction, e.g., x-direction, and the gate electrodes 123 may extend along a second direction, e.g., y-direction. The x-direction may cross, e.g., be perpendicular to, the y-direction. Embodiments are not limited to such features and/or arrangements. For example, in some embodiments, the first conductive pattern 140 may include a wave-like pattern.

By arranging the first conductive pattern 140 directly on the semiconductor substrate 100, a conductive plug arranged on a layout layer between a layout level of the first conductive pattern 140 and a respective active area 103 is not necessary. Embodiments may provide semiconductor devices, e.g., DRAM device 10, in which a first conductive pattern, e.g., a bit line, is at a lower height relative to the semiconductor substrate 100, e.g., the first conductive pattern 140 is directly on the semiconductor substrate 100. Embodiments may provide semiconductor devices in which a total height of the semiconductor device is reduced. Embodiments may provide semiconductor devices in which a loading capacitance thereof is reduced. Embodiments may provide semiconductor devices for which a manufacturing process thereof is simplified, e.g., not necessary to produce conductive plug on intermediate layer, as compared to conventional devices.

FIGS. 2A, 2B, 3A, 3B, 4A, 4B, 5A, 5B, 6A, and 6B illustrate exemplary layout diagrams of first conductive patterns 140 and cell active areas 103 employable by the DRAM device 10 of FIG. 1. Referring to FIGS. 2A, 2B, 3A, 3B, 4A, 4B, 5A, 5B, 6A, and 6B, exemplary layout diagrams of the first conductive pattern 140 and the active areas 103 may include common areas 80 where the first conductive pattern 140 and the active areas 103 directly overlap and directly contact each other. The common areas 80 may correspond to overlapping regions of the active area 103 and the first conductive pattern 140. In some embodiments, e.g., the common areas 80 may correspond to a region between, e.g., two gate electrodes 123. The common areas 80 may, e.g., correspond to protruding portions of the first conductive pattern 140 and/or the active areas 103 that are adapted to directly overlap the active area 103 and the first conductive pattern 140, respectively. In such embodiments, e.g., a size and/or a shape of each protruding portion may be set so as to enable an electrical connection and data flow between the first conductive pattern 140 and the corresponding active area 103. In embodiments in which the first conductive pattern 140 itself includes a protruding portion and/or the active area 103 includes a protruding portion, a manufacturing method may be simplified, e.g., a photolithography step for forming a common area independent of forming the first conductive pattern 140 and/or the active area 103 may be omitted.

It should be understood that embodiments of the common areas 80 are not limited to protruding portions of the first conductive pattern 140 and/or the active areas 103. For example, in some embodiments, neither the first conductive pattern 140 nor the active area 103 may have a protruding portion, and the common area 80 may result from a general arrangement, i.e., overlapping arrangement, of the first conductive pattern 140 relative to the active area 103. In some other embodiments, e.g., the common area 80 may be a result of an intermediate pattern on a same layout level as the first conductive pattern 140 that is between the first conductive pattern 140 and the respective active area 103.

Figure 2A:
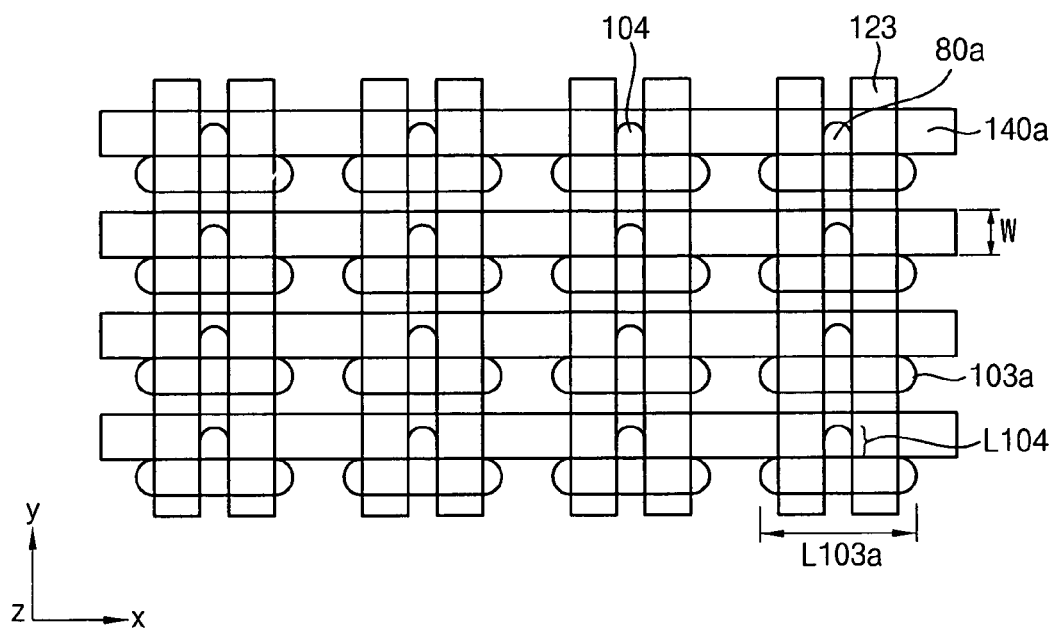
FIGS. 2A, 3A, 4A, 5A, and 6A illustrate exemplary layout diagrams of gate electrodes, first conductive patterns and cell active areas employable by the DRAM device of FIG. 1.
Figure 2B:
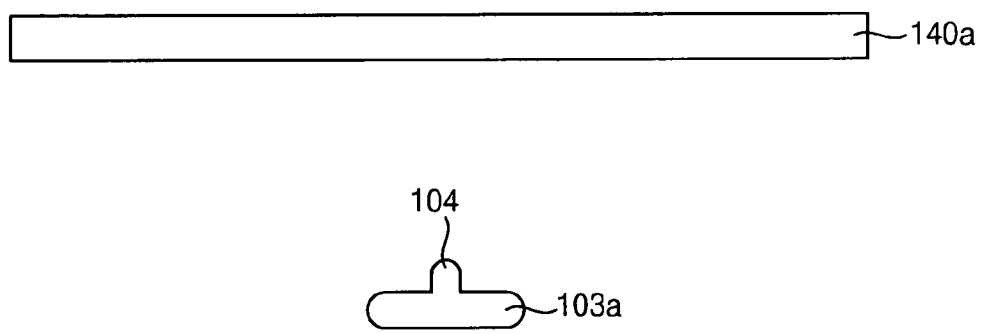
FIGS. 2B, 3B, 4B, 5B, and 6B illustrate the exemplary layout diagrams of the first conductive patterns and the active cell areas of FIGS. 2A, 3A, 4A, 5A, and 6A individually.

Referring to FIGS. 2A and 2B, e.g., the first conductive pattern 140a may have a line-type pattern, and the active areas 103a may have an island-type pattern including a protruding portion 104. In the exemplary embodiment shown in FIGS. 2A and 2B, the active areas 103a include the protruding portions 104, and the first conductive pattern 140a does not include a protruding portion for establishing one or more common areas 80a. Each of line-type patterns of the first conductive pattern 140a may have a substantially oval or rectangular shape. The line-type patterns of the first conductive pattern 140a may be arranged parallel to each other so as to form a striped pattern. A length of the first conductive pattern 140a along an x-direction may be substantially longer than a length $L_{103a}$ of the active area 103a along the x-direction such that each line-type pattern of the first conductive pattern 140a may be associated with a plurality of the active areas 103a.

Referring to FIGS. 2A and 2B, the island-type pattern of the active areas 103a may have a substantially oval or rectangular shape within the semiconductor substrate 100. In such embodiments, e.g., the protruding portions 104 thereof may protrude, e.g., from a side of the active areas 103 so as to form, e.g., a T-like shape. The length $L_{103a}$ of the active area 103a may be substantially greater than a length $L_{104}$ of the protruding portion 104 thereof. The length $L_{104}$ of the protruding portion 104 may be shorter than a width $W_{10a}$ of the line-type patterns of the first conductive pattern along the y-direction. The protruding portions 104 may have a substantially U-like and/or semicircular shape. More particularly, e.g., the active area 103a and the first conductive pattern 140a may extend in a same and/or similar direction, e.g., the x-direction, and the protruding portions 104 may extend in a direction that crosses the direction along which the first conductive pattern 140a and/or the active area 103a extend, e.g., the protruding portions 104 may extend in the y-direction. In some embodiments, the protruding portions 104 may directly contact a portion of the respective active area 103 between a pair of the gate electrodes 123, e.g., two adjacent ones of the gate electrodes 123.

In general, only differences between the exemplary embodiments of FIGS. 2A and 2B and the exemplary embodiments of FIGS. 3A, 3B, 4A, 4B, 5A, 5B, 6A, and 6B, respectively, will be described below.

Figure 3A:
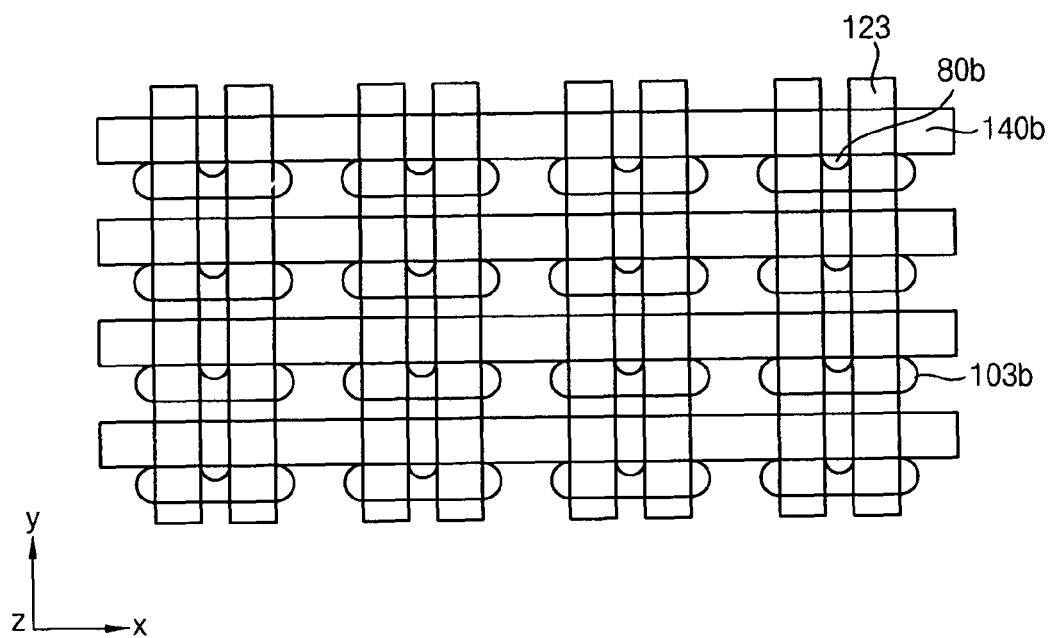
Figure 3B:
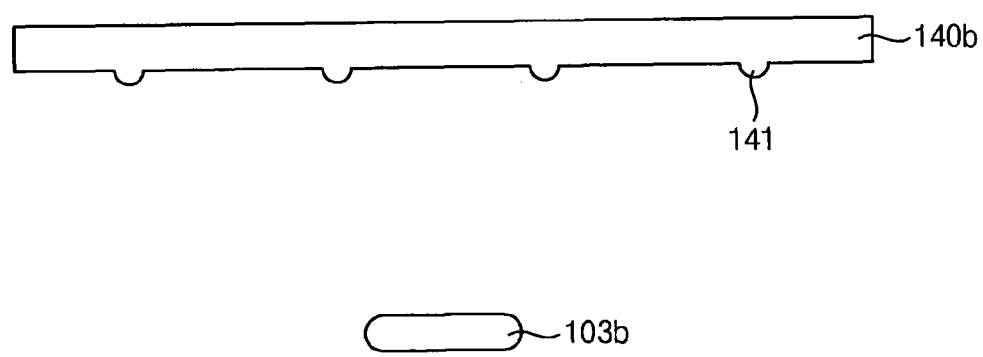

In the exemplary embodiment of FIGS. 3A and 3B, a first conductive pattern 140b includes protruding portions 141 and active areas 103b do not include protruding portions for establishing one or more common areas 80b. The first conductive pattern 140b may have a substantially line-type pattern, and the active areas 103b may have an island-type pattern. The first conductive pattern 140b may have a line-type pattern, and each line of the line-type pattern may have, e.g., an oval or rectangular shape. The protruding portions 141 of the first conductive pattern 140b may have a substantially U-like and/or semicircular shape. The active areas 103b may have a substantially oval and/or rectangular shape. More particularly, e.g., the active area 103b and the first conductive pattern 140b may extend in a same and/or similar direction, e.g., the x-direction, and the protruding portions 141 may extend in a direction that crosses the direction along which the first conductive pattern 140b and/or the active area 103b extend, e.g., the protruding portions 141 may extend in the y-direction. In some embodiments, the protruding portions 141 may directly contact a portion, e.g., a source/drain 132, of the respective active area 103 associated with a pair of the gate electrodes 123, e.g., two adjacent ones of the gate electrodes 123.

Referring to FIGS. 4A, 4B, 5A, and 5B, in some embodiments, the first conductive pattern 140 and the active areas 103 may both include protruding portions. For example, in the exemplary embodiment of FIGS. 4A and 4B, the first conductive pattern 140b includes the protruding portions 141, and an active area 103a' includes protruding portions 104' for establishing one or more common areas 80c. Similarly, e.g., in the exemplary embodiment of FIGS. 5A and 5B, the first conductive pattern 140b includes the protruding portions 141, and the active area 103a includes the protruding portions 104 for establishing one or more common areas 80d.

Figure 4A:
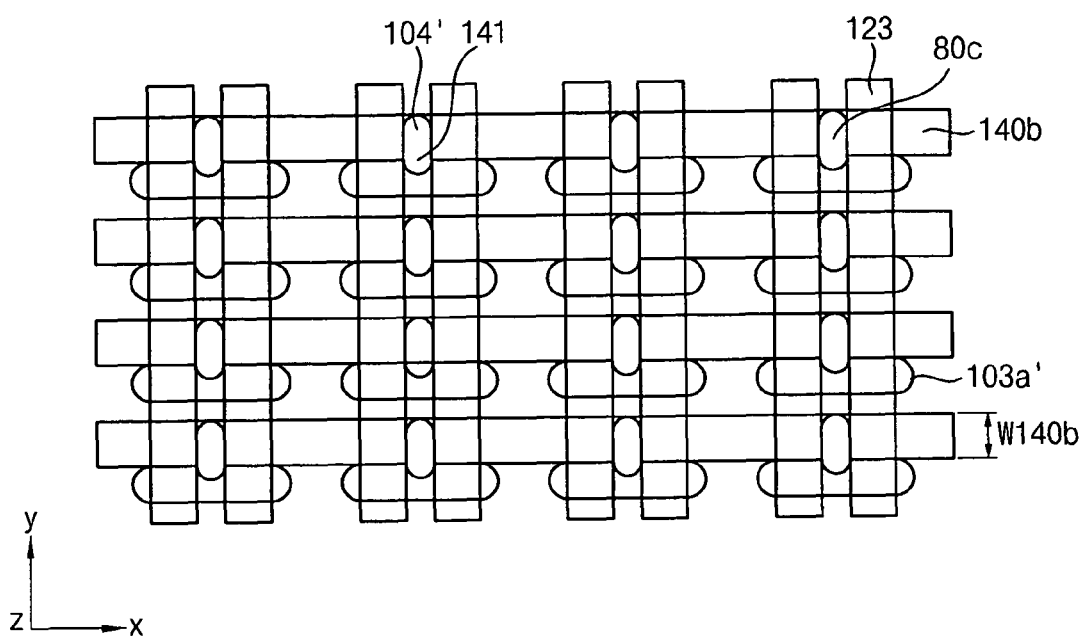
Figure 4B:
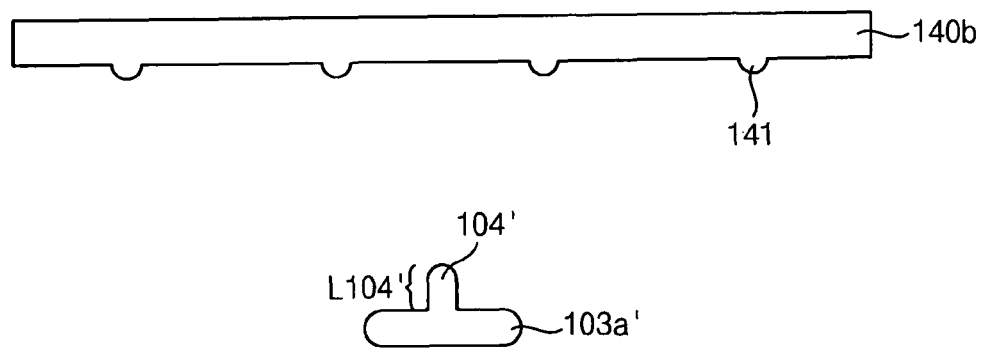
Figure 5A:
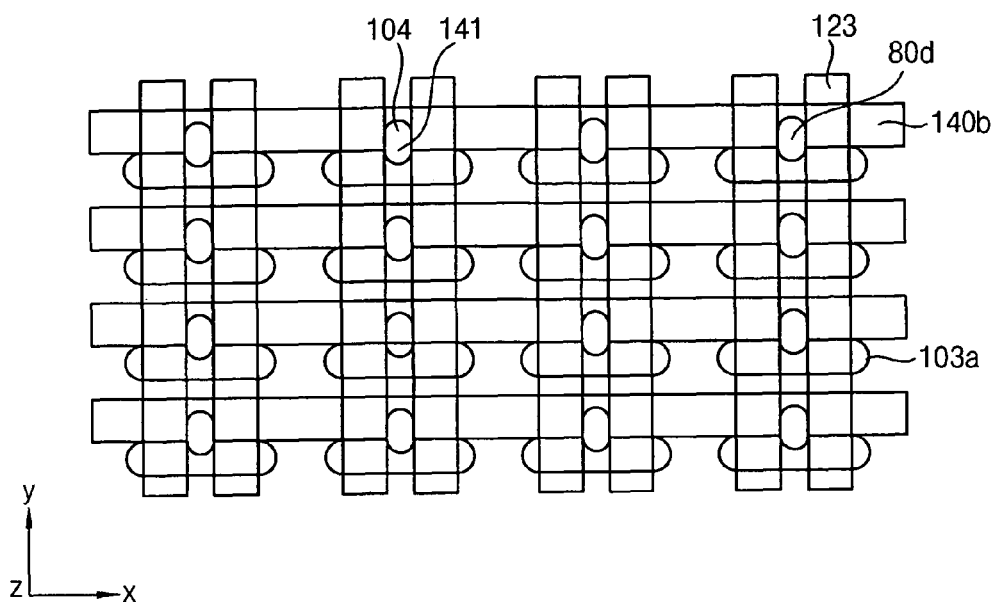
Figure 5B:
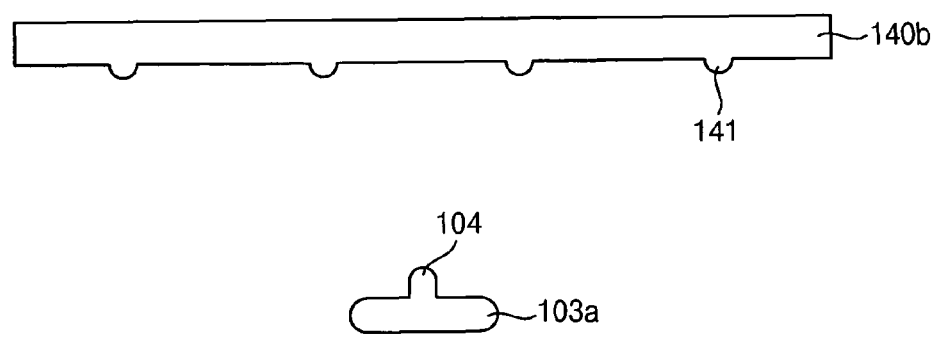

More particularly, in the exemplary embodiment of FIGS. 4A and 4B, a length $L_{104'}$ of the protruding portion 104' is completely and/or substantially equal a width $W_{140b}$ of the first conductive patterns 140b along the y-direction. Increasing an area of the common area 80c, may enable contact resistance to be improved. In the exemplary embodiment of FIGS. 5A and 5B, the length $L_{104}$ of the protruding portions 104 is less than the width $W_{140b}$ of the first conductive patterns 140b along the y-direction.

Figure 6A:
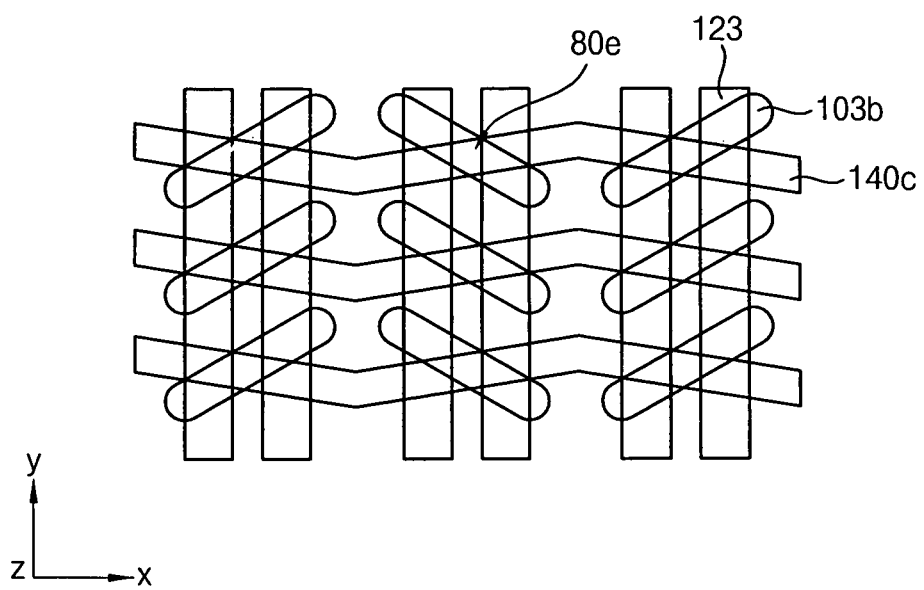
Figure 6B:
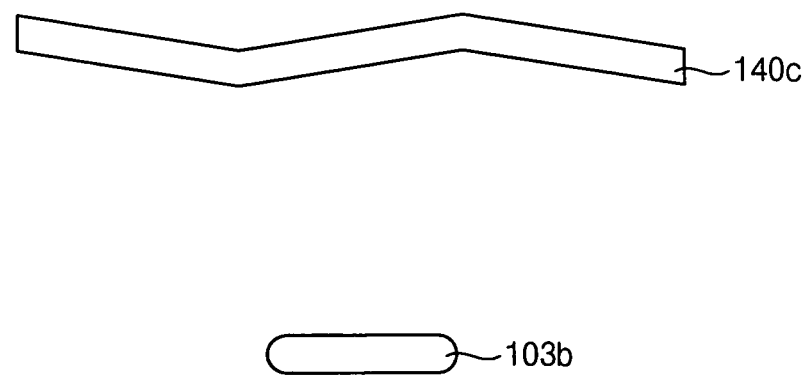

Referring to FIGS. 6A and 6B, in some embodiments, neither a first conductive pattern 140e nor the active areas 103b may include protruding portions. The first conductive pattern 140e may have a wave-like pattern and the active areas 103b may be substantially diagonally arranged so as to directly overlap the first conductive patterns 140e to establish one or more common areas 80e. More particularly, e.g., the active areas 103b may be diagonally arranged relative to a respective portion of the first conductive pattern 140e. Each of the active areas 103b may directly overlap a respective portion of the first conductive pattern 140e between two adjacent ones of the gate electrodes 123.

FIGS. 7A, 8A, 9A, 10A, 11A, 12A, 13A, 14A, 15A, 16A, 17A, 18, and 19 illustrate cross sectional views of intermediate structures of stages in an exemplary method of forming the DRAM device 10 of FIG. 1. FIGS. 7B, 8B, 9B, 10B, 11B, 12B, 13B, 14B, 15B, 16B and 17B illustrate plan views from a top of the intermediate structures shown in FIGS. 7A, 8A, 9A, 10A, 12A, 12A, 13A, 14A, 15A, 16A, and 17A, respectively, of the stages in the exemplary method of forming the exemplary DRAM device 10 of FIG. 1. In the following description, it may be assumed that the DRAM device 10 employs the exemplary layout diagrams of the first conductive pattern 140b and the cell active areas 103a illustrated in FIGS. 5A and 5B.

Figure 7A:
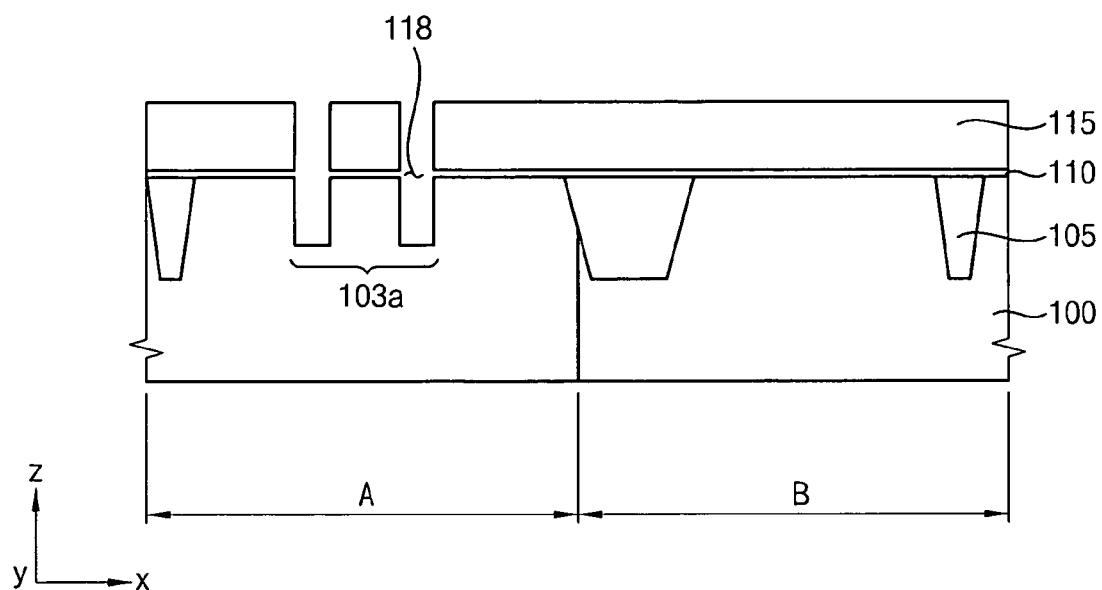
FIGS. 7A, 8A, 9A, 10A, 11A, 12A, 13A, 14A, 15A, 16A, 17A, 18, and 19 illustrate cross sectional views of intermediate structures of stages in an exemplary method of forming the DRAM device of FIG. 1.
Figure 7B:
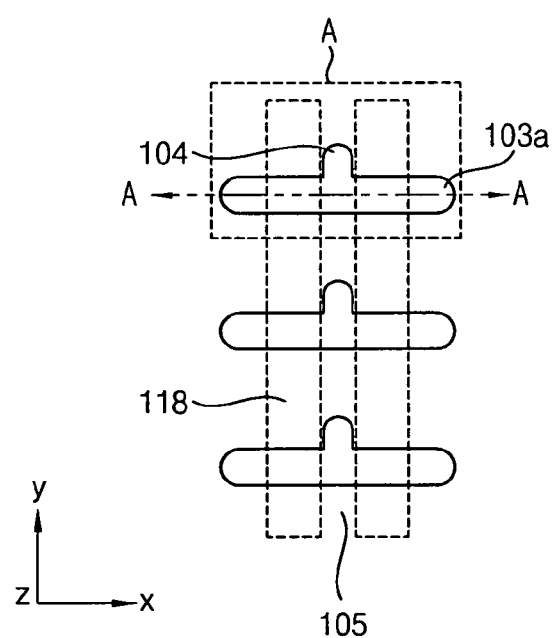
FIGS. 7B, 8B, 9B, 10B, 11B, 12B, 13B, 14B, 15B, 16B, and 17B illustrate plan views from a top of the intermediate structures shown in FIGS. 7A, 8A, 9A, 10A, 12A, 12A, 13A, 14A, 15A, 16A, and 17A, respectively, of the stages in the exemplary method of forming the exemplary DRAM device of FIG. 1.

Referring to FIGS. 7A and 7B, a semiconductor substrate 100 may be patterned to isolate portions thereof. For example, an upper portion of the semiconductor substrate 100 may be patterned to form isolations 105, e.g., via shallow trench isolation (STI). STI may include, e.g., forming a trench in the substrate 100, forming a thermal oxide layer in the trench, forming a nitride layer on the thermal oxide layer, filling the trench using, e.g., chemical vapor deposition (CVD) and/or high density plasma (HDP) deposition, and/or planarizing a resulting surface via chemical mechanical polishing (CMP). The isolations 105 may define island-type patterns that may correspond to the active areas 103a. More particularly, in embodiments in which the active areas 103a include protrusions, e.g., 104 in FIGS. 5A, 5B, 7A, and 7B, the isolations 105 may define such island-type patterns including such protruding portions.

A pad oxide 110 may be formed on the substrate 100. The pad oxide 110 may be formed via, e.g., thermal oxidation, and may have a thickness of about 50 Angstroms to about 150 Angstroms.

A hard mask layer 115 may be formed on the pad oxide 110. The hard mask layer 115 may include, e.g., silicon nitride. The hard mask layer 115 may have a different etch selectivity than the substrate 100 and/or the pad oxide 110. In some embodiments, the hard mask layer 115 may have a multilayer structure. Referring still to FIGS. 7A and 7B, the hard mask layer 115 may be patterned, and the patterned hard mask layer 115 may be used to form recesses 118 in the active area 103a of the substrate 100. More particularly, the pad oxide 110 and the hard mask layer 115 may be patterned in the cell region A. The recesses 118 may correspond to respective portions of the substrate 100 where buried gates 125 may be later formed. A lower surface of the recesses 118 may be curved, e.g., rounded, in order to increase a surface area thereof.

Figure 8A:
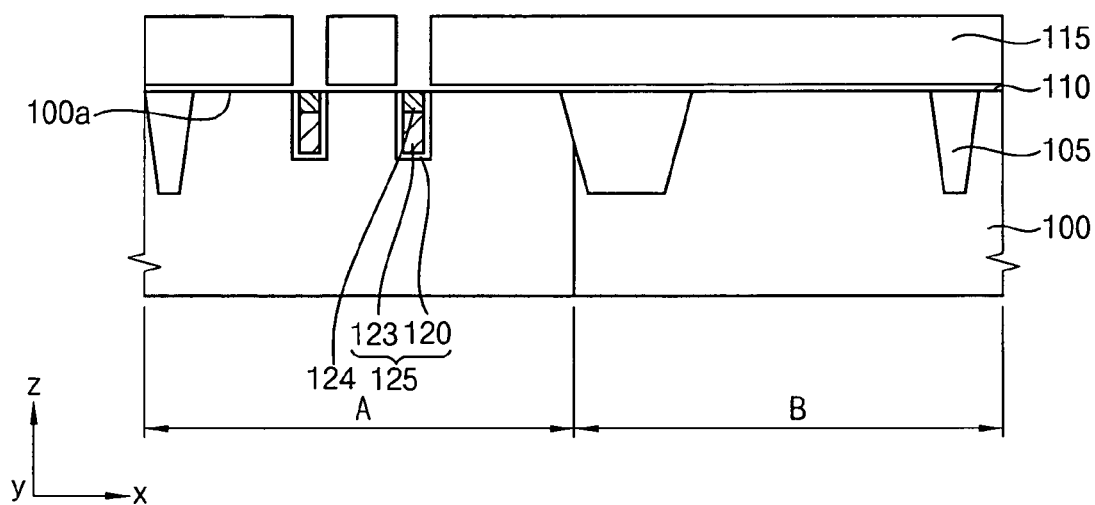
Figure 8B:
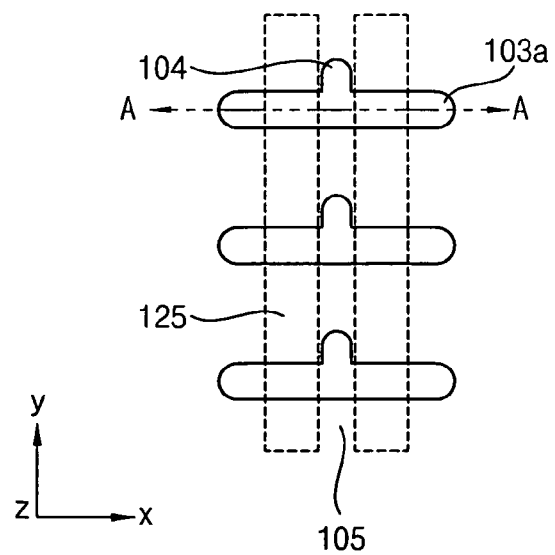

Referring to FIGS. 8A and 8B, a gate insulating layer 120 may be formed on the active area 103a, and, more particularly, in the recesses 118. The gate insulating layer 120 may include, e.g., hafnium oxide (HfOx), aluminum oxide (AlOx), tantalum oxide (TaOx), etc. In some embodiments, the gate insulating layer 120 may include a multilayer structure including, e.g., a lower oxide film, a nitride film and an upper oxide film. The gate insulating layer 120 may have a thickness of about 30 Angstroms to about 70 Angstroms.

A gate electrode 123 may be formed on the gate insulating layer 120 within the respective recess 118. The gate electrode 123 may be a BCAT structure such that at least a portion and/or all of the gate electrode 123 is below the upper surface 100a of the semiconductor substrate 100. By forming the gate electrode 123 partially and/or completely below the upper surface 100a of the semiconductor substrate 100, a height of the device, e.g., DRAM device 10, may be reduced. In the exemplary embodiment illustrated in FIGS. 8A and 8B, the gate electrode 123 is completely buried below the upper surface 100a of the semiconductor substrate 100. The gate electrode 123 may extend along the y-direction so as to cross over the active area 103b extending along the x-direction. The gate electrode 123 may include, e.g., polysilicon, a metal and/or a metal compound. For example, the gate electrode 123 may include polysilicon doped with impurities, such as, e.g., titanium nitride (TiNx), tungsten nitride (WNx), tantalum nitride (TaN), titanium silicon nitride (TiSiN), and/or tungsten silicon nitride (WSiNx), etc. The gate electrode 123 may be formed using, e.g., an atomic layer deposition (ALD) process, a CVD process, etc.

A gate capping pattern 124 may be formed on the gate electrode 123. The gate capping pattern 124 may include, e.g., SiN. After depositing the capping material, an etchback process, CMP, etc., may be performed.

Figure 9A:
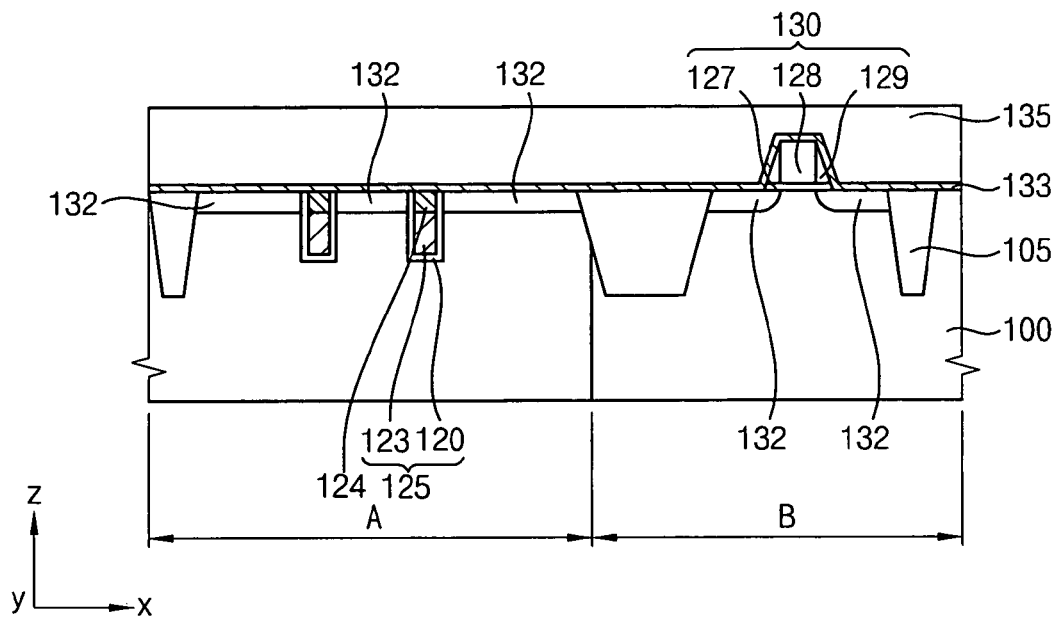
Figure 9B:
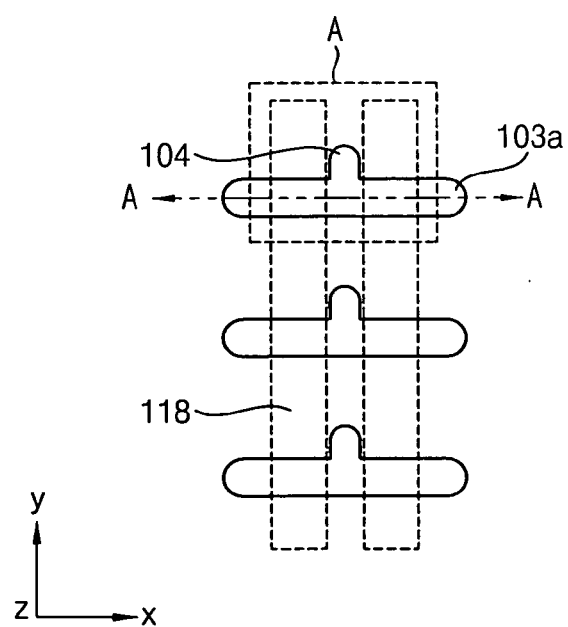

Referring to FIGS. 9A and 9B, the pad oxide 110 and the hard mask layer 115 may be removed. The pad oxide 110 and the hard mask layer 115 may be removed using, e.g., a wet etch process.

A peripheral gate electrode 130 may be formed in the periphery region B. The peripheral gate electrode 130 may include a second gate insulating layer 127, a second gate electrode 128, and a gate spacer 129. The second gate insulating layer 127 may include same or similar materials and/or be formed using a same or similar process to the gate insulating layer 120. The second gate electrode 128 may include same or similar materials and/or be formed using a same or similar process to the gate electrode 123. The gate spacers 129 may be formed on sidewalls of the second gate electrode 128. The gate spacers 129 may include a dielectric material, e.g., silicon oxide, silicon nitride, etc. The material may be conformally formed on the second gate electrode 128 before being anisotropically etched to form the gate spacers 129.

Source/drain impurities may then be doped into respective portions of the semiconductor substrate 100. More particularly, source/drain regions 132 may be formed by doping source/drain impurities into respective portions of the cell region A and/or the periphery region B of the semiconductor substrate 100.

A first etch stop layer 133 may be formed on the semiconductor substrate 100. More particularly, the first etch stop layer 133 may be formed on exposed portions of the semiconductor substrate 100 and the peripheral gate electrode 130. The etch stop layer 133 may include, e.g., nitride. The etch stop layer 133 may be formed using, e.g., a nitride CVD process. The etch stop layer 133 may have a thickness of about 100 Angstroms to about 200 Angstroms.

A first insulating interlayer 135 may be may be formed on the etch stop layer 133. The first insulating interlayer 135 may be formed using, e.g., an oxide CVD process. The first insulating interlayer 135 may have a thickness of about 1,000 Angstroms to about 3,000 Angstroms. The first insulating interlayer 135 may be planarized, e.g., using a CMP process.

Figure 10A:
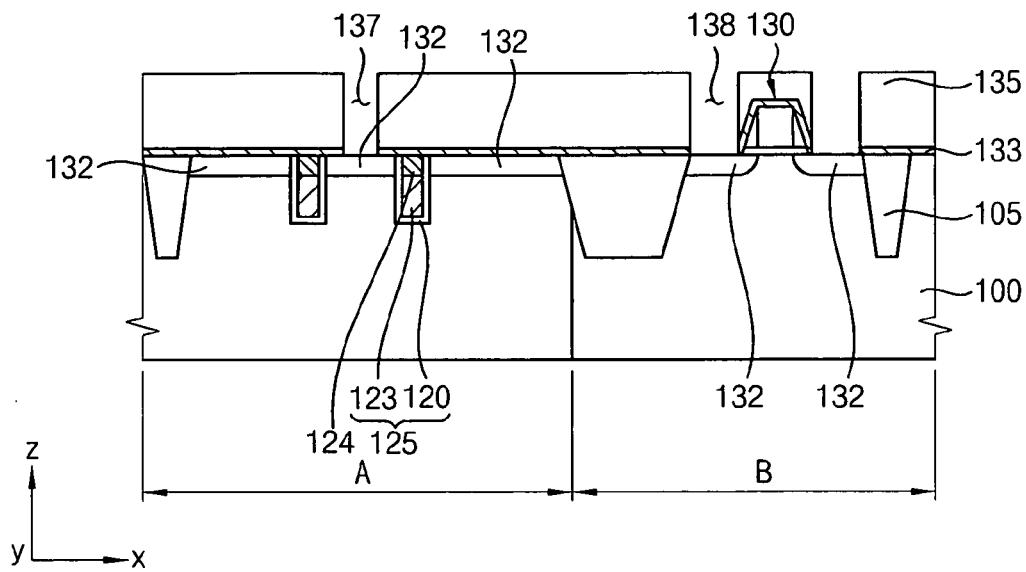
Figure 10B:
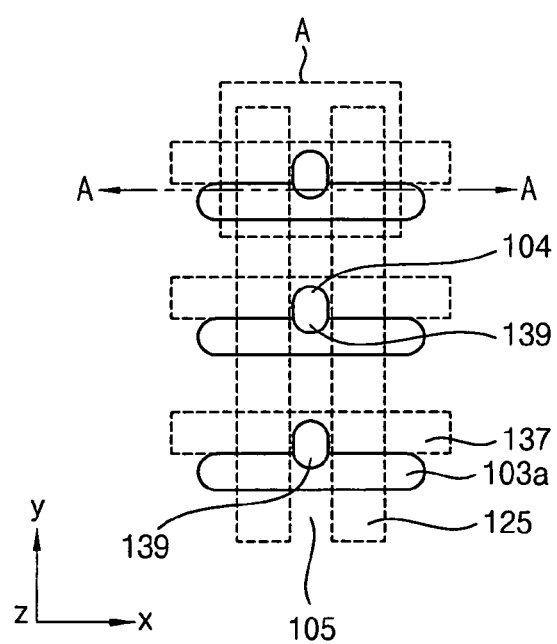
Figure 11A:
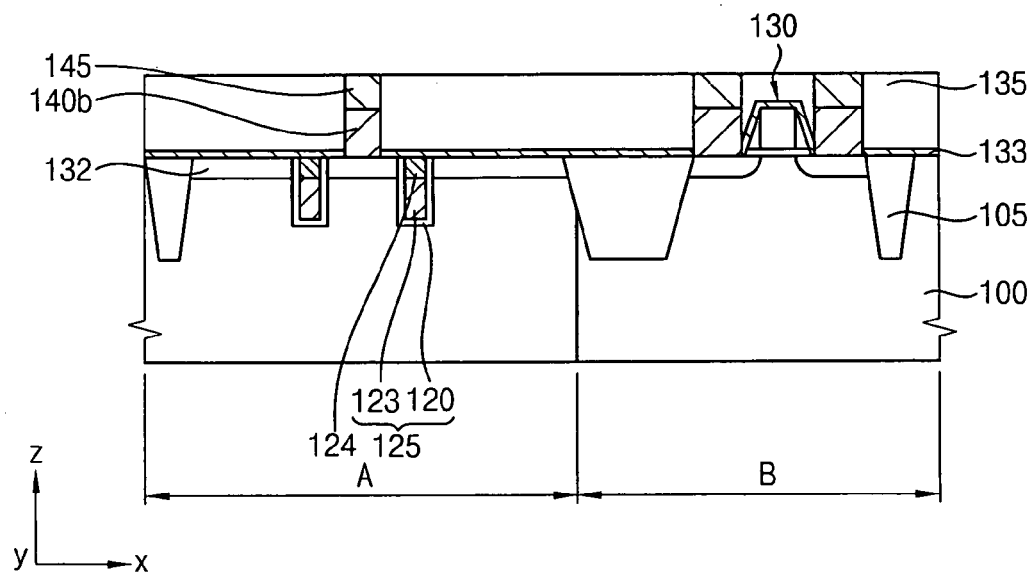
Figure 11B:
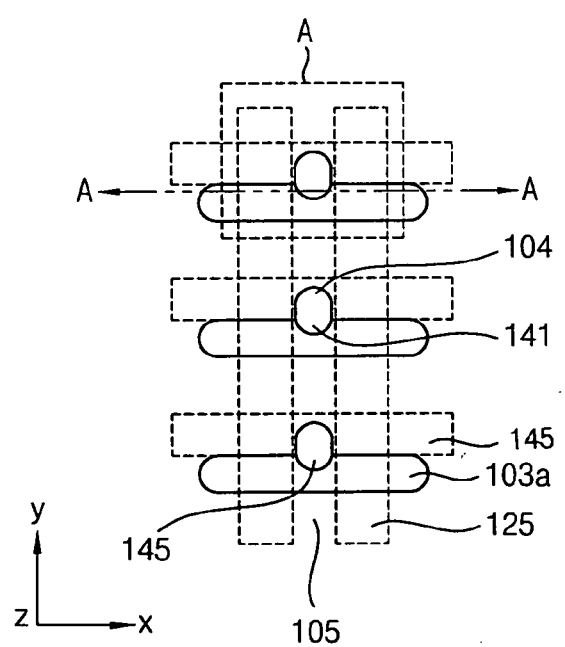

Referring to FIGS. 10A and 10B, the first insulating interlayer 135 may be patterned to form recesses 137, 138. More particularly, the first insulating interlayer 135 may be patterned to expose portions of the semiconductor substrate 100 where the first conductive pattern 140 is to be formed. As shown in FIGS. 10A and 10B, the first insulating interlayer 135 may be selectively patterned, e.g., etched, to form recesses 137 extending substantially adjacent to the respective active areas 103a. The recesses 137 may extend along the x-direction and may extend beyond a plurality of the active areas 103a and may cross over a plurality of the buried gates 125. In the exemplary embodiment illustrated in FIGS. 5A and 5B, the first conductive layer 140b includes protruding portions 141. In such embodiments in which the first conductive layer 140b includes protruding portions 141, the recesses 137 may also include protruding portions 139 exposing a portion, e.g., respective source/drain region 132, of the respective active area 103a. The recesses 137 may be substantially adjacent to and/or offset from the corresponding active areas 103a such that only a protruding portion 139 thereof may expose a portion of the respective active area(s) 103a. For example, to form the first conductive layer 140b of FIGS. 5A and 5B, the first insulating interlayer 135 may expose portions of the active area 103a between adjacent ones of the gate electrodes 123 corresponding to the common area 80d, portions of the semiconductor substrate adjacent to the active areas 103a in a line-type pattern, and/or source/drain regions 132 corresponding to the peripheral gate electrode 130 having, e.g., a plug-type pattern.

Referring to FIGS. 11A, 11B, 12A, and 12B, the first conductive pattern 140b and a capping pattern 145 may be formed corresponding to the recesses 137, 138. The first conductive pattern 140 may correspond to cell bit lines in the cell region A of the DRAM device 10. In the periphery region B, the respective portion of the first conductive pattern 140b may correspond to a lower portion of a periphery bit line. The first conductive pattern 140b may include, e.g., titanium nitride, tungsten nitride, tantalum nitride, titanium silicon nitride, and/or tungsten silicon nitride, etc. The capping pattern 145 may include a silicon oxide layer, a silicon nitride layer and/or a silicon oxynitride layer.

Figure 13A:
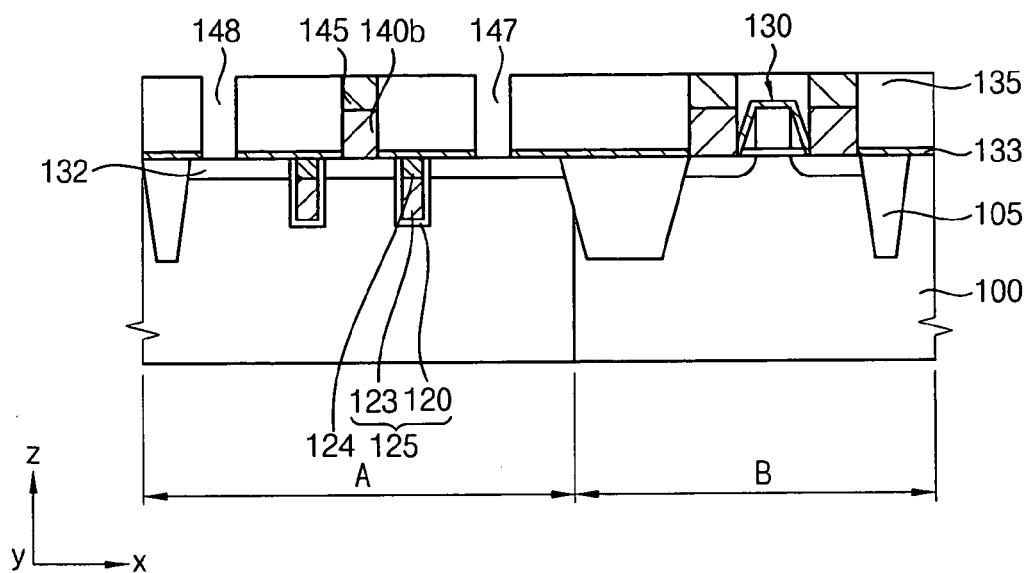
Figure 13B:
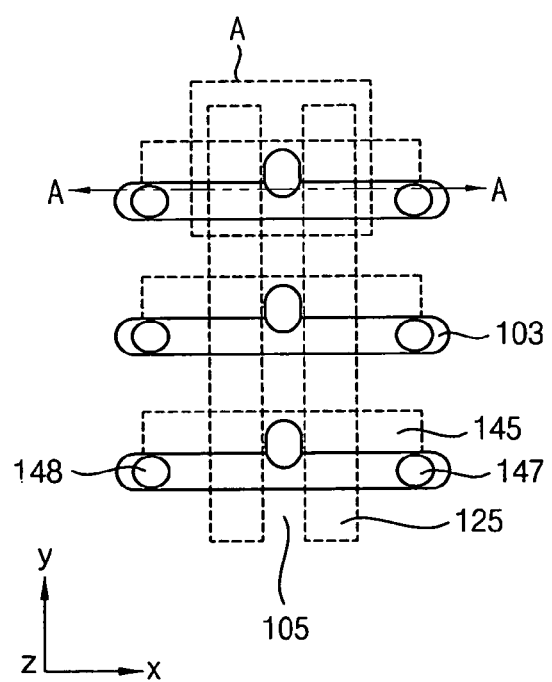

Referring to FIGS. 13A and 13B, recesses 147, 148 may be formed in the first insulating interlayer 135. The first insulating interlayer 135 may be selectively patterned, e.g., etched, to form the recesses 147, 148. The recesses 147, 148 may be formed so as to provide a conductive path to the respective source/drain regions 132. More particularly, the recesses 147, 148 may expose respective portions of the source/drain regions 132 in the cell region A.

Figure 14A:
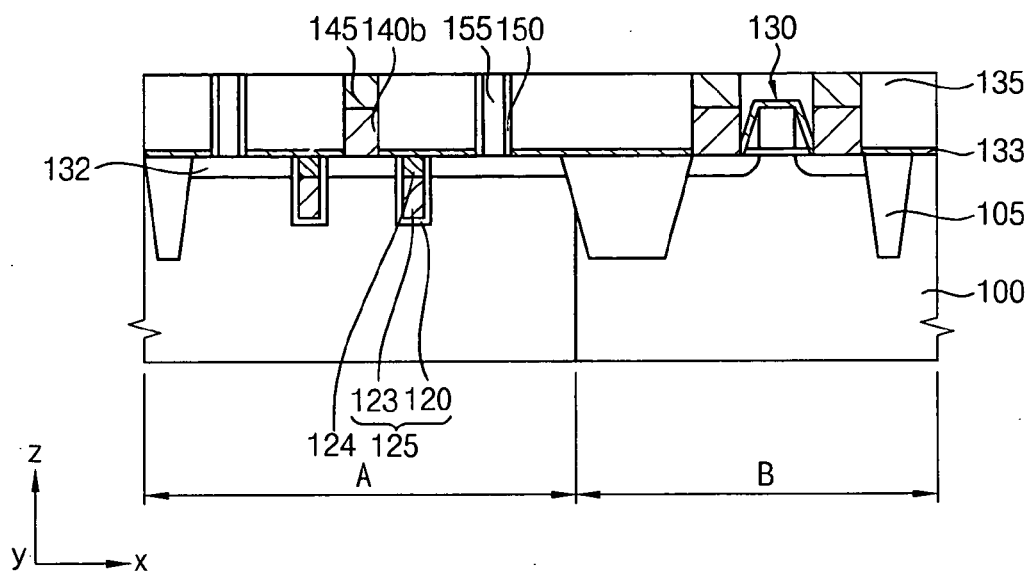
Figure 14B:
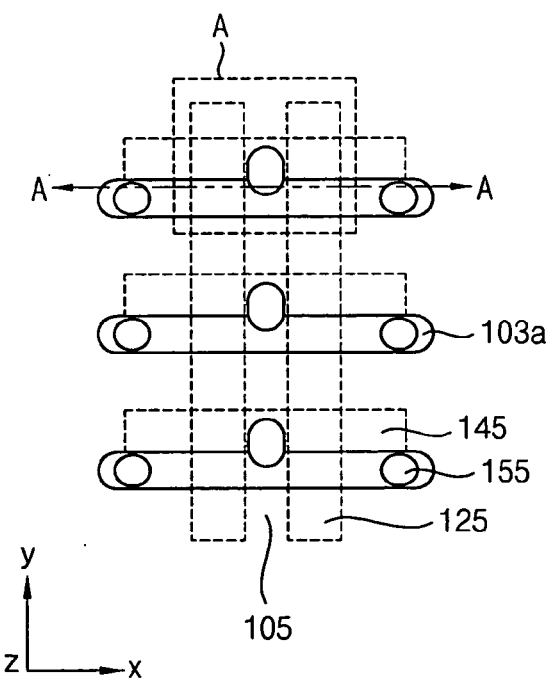

Referring to FIGS. 14A and 14B, a spacer 150 and a second conductive pattern 155 may be formed in the recesses 147, 148. The spacer 150 may include, e.g., oxide and/or nitride. The spacer 150 may cover exposed sidewalls of the recesses 147, 148. The second conductive patterns 155 may be formed on the semiconductor substrate 100 within a space defined by the spacer 150. The second conductive layer 155 may include, e.g., doped polysilicon, and may be formed using, e.g., CVD. The spacers 150 may electrically isolate the first conductive layer 140b and the second conductive pattern 155. The second conductive patterns 155 may correspond to capacitor pads.

Figure 15A:
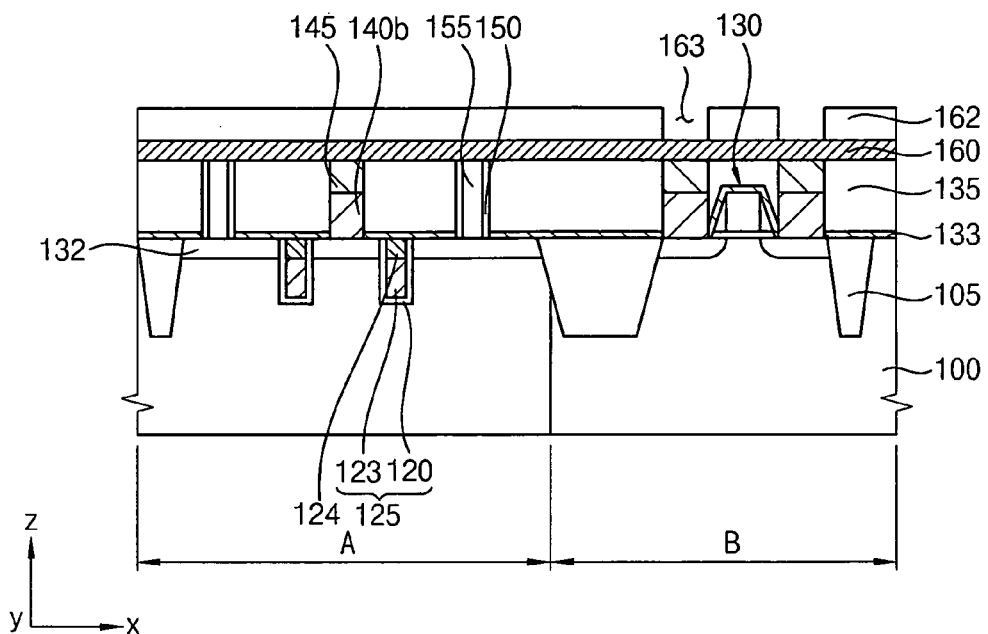
Figure 15B:
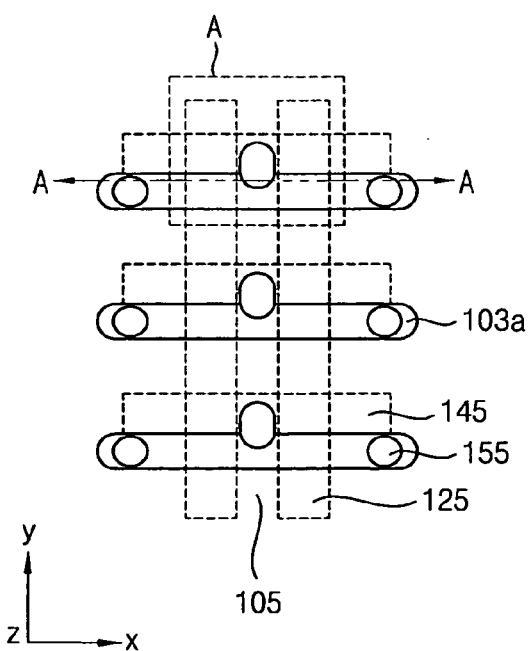

Referring to FIGS. 15A and 15B, a second etch stop layer 160 may be formed on the first insulating interlayer 135. More particularly, e.g., the second etch stop layer 160 may be formed on the first insulating interlayer 135, the spacers 150, the second conductive pattern 155, and the capping pattern 145. The second etch stop layer may include, e.g., silicon nitride, and may be formed using, e.g., a CVD process. The second etch stop layer 162 may have a thickness of about 100 Angstroms to about 200 Angstroms.

A mask layer 162 may be formed on the second etch stop layer 160. The mask layer 162 may be patterned to form recesses 162. The recesses 162 may be formed by removing, e.g., etching, portions of the mask layer 162 above the first conductive pattern 140b in the periphery region B. The patterned mask layer 162 may be used to remove, e.g., etch, portions of the capping pattern 145 in the periphery region B. After removing the capping pattern 145 on respective portions of the first conductive pattern 140b in the periphery region B, respective portions of the first conductive pattern 140b may be exposed.

More particularly, the patterned mask layer 162 may be used to remove portions of the capping pattern 145 on the first conductive pattern 140b in the periphery region B. The capping pattern 145 may not be removed in the cell region A. More particularly, in the cell region A, the capping pattern 145 may protect the first conductive pattern 140b during subsequent processing, e.g., formation of one or more capacitor 175. However, in the periphery region B, the capping pattern 145 may increase a resistance associated with the respective first conductive pattern 140b, e.g., increase a resistance of a peripheral bit line. Thus, the capping pattern 145 may be removed in the periphery region B in order to, e.g., reduce a resistance of the periphery bit line.

Figure 16A:
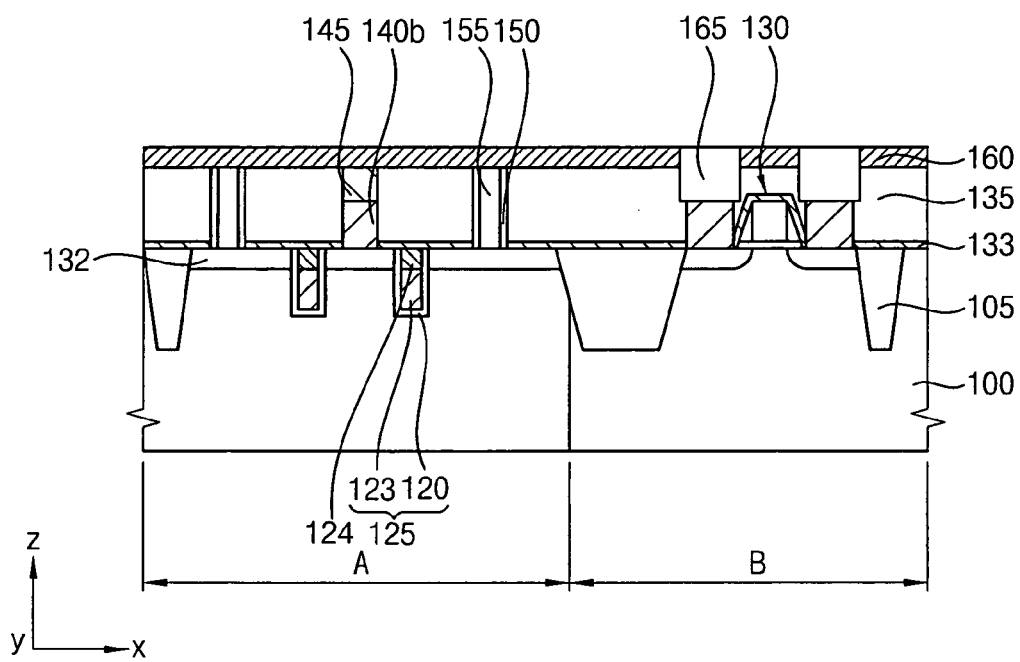
Figure 16B:
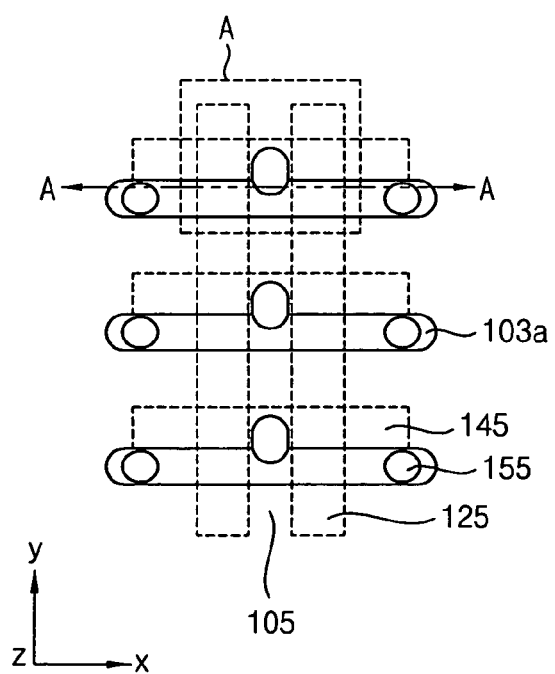

Referring to FIGS. 16A and 16B, a third conductive pattern 165 may be formed on the exposed portions of the first conductive pattern 140b in the periphery region B. The third conductive pattern 165 may be formed using, e.g., a damascene process. The third conductive pattern 165 may include, e.g., a relatively high conductive material, e.g., copper, cobalt silicide, tungsten, etc.

Figure 17A:
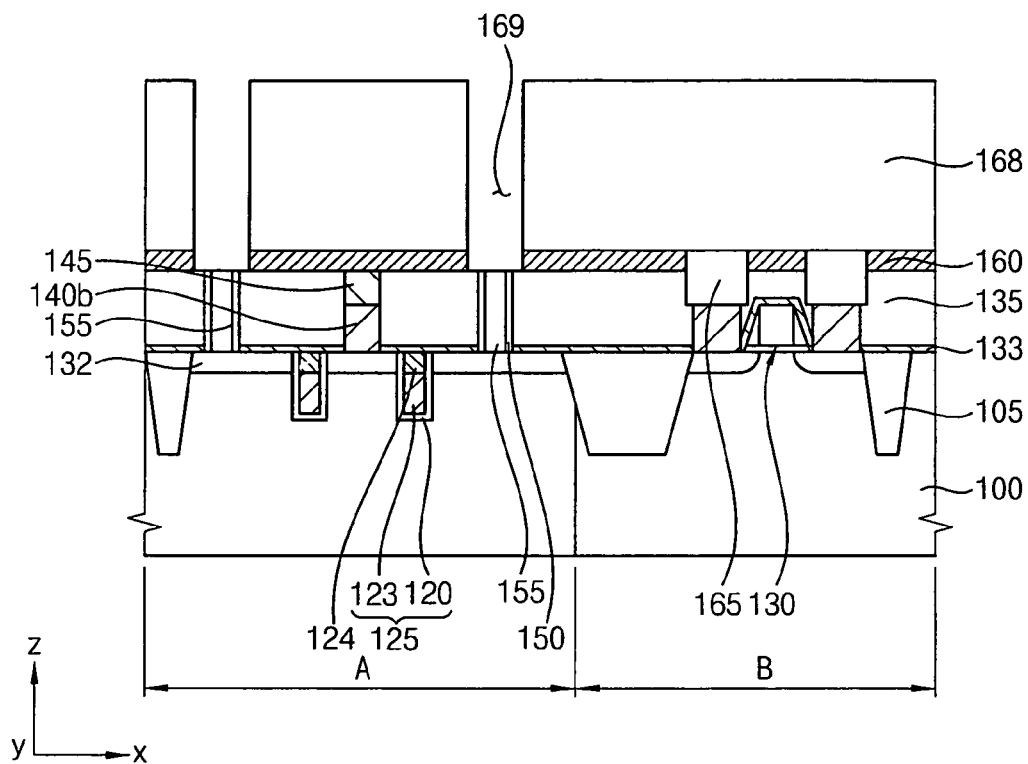
Figure 17B:
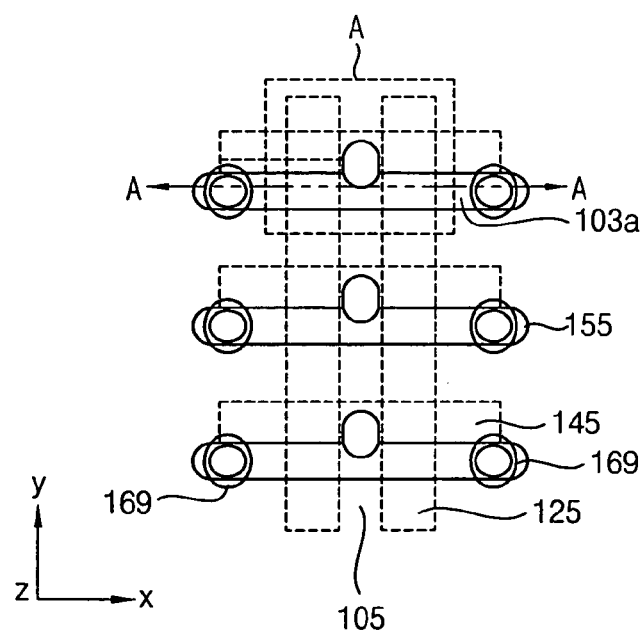

Referring to FIGS. 17A and 17B, a mold layer 168 may be formed on the second etch stop layer 160. A thickness of the mold layer 168 may be set based on design characteristics, e.g., surface area, of a capacitor 175 to be formed therein (see FIG. 18). For example, the mold layer 168 may have a thickness of about 10,000 Angstroms to about 20,000 Angstroms. The mold layer 168 may include a single layer or a plurality of sub-layers having, e.g., different etch rates.

A plurality of recesses 169 may be formed in the mold layer 168. More particularly, the recesses 169 may be formed at respective portions of the mold layer 168 above the second conductive patterns 155 so as to thereby expose the second conductive pattern 155 by removing using, e.g., photolithography, respective portions of the mold layer 168 and the second etch stop layer 160. The recesses 169 may expose, e.g., upper surfaces of the second conductive patterns 155, the spacers 150 and the first insulating interlayer 135.

Figure 18:
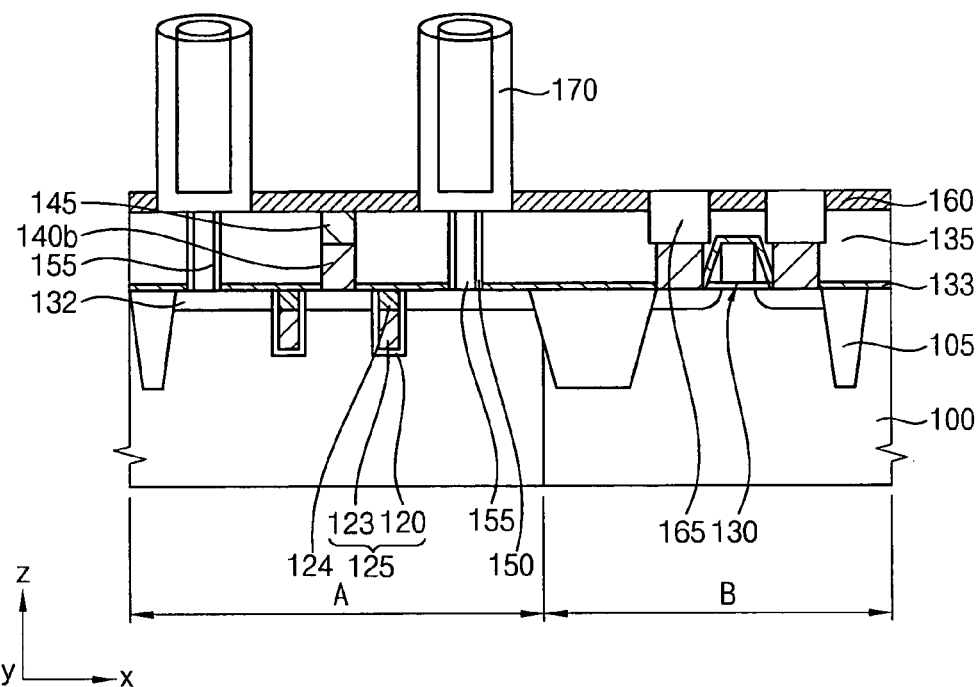

Referring to FIG. 18, the capacitor first electrode 170 may be formed on the mold layer 168, and more particularly, in the recesses 169. The capacitor first electrode 170 may include, e.g., TiN, Ti, TaN, Pt, etc. The capacitor first electrode 170 may electrically contact, e.g., directly contact, the corresponding second conductive pattern 155. As shown in FIG. 18, the mold layer 168 may be removed, and the capacitor first electrode 170 may be supported, e.g., by respective portions of the second etch stop layer 160. In such embodiments, the second etch stop layer 160 may have a sufficient thickness to support the capacitor first electrode 170 between respective portions thereof.

Figure 19:
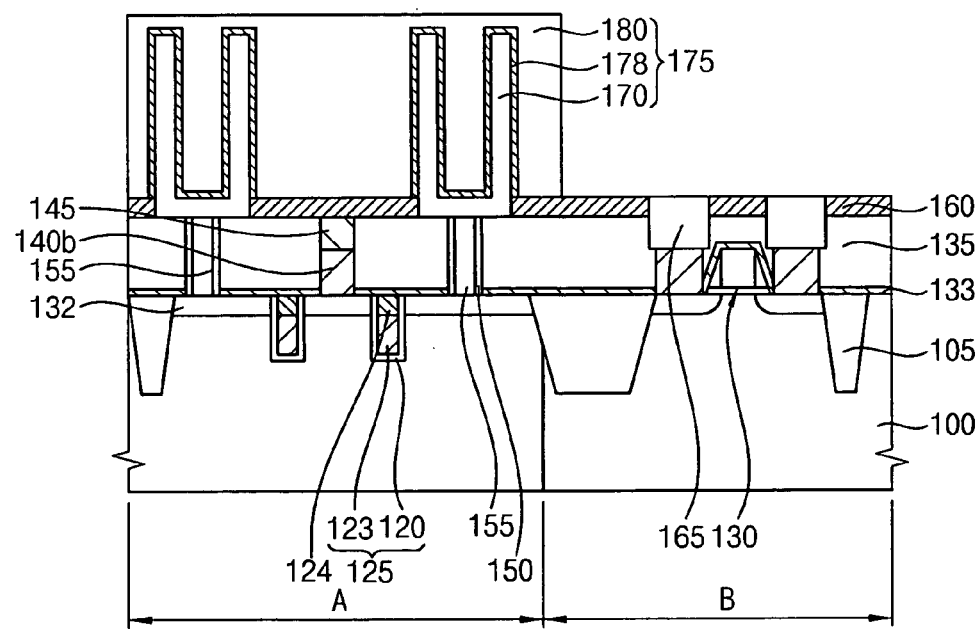

Referring to FIG. 19, the capacitor dielectric layer 178 may be formed on the capacitor first electrode 170. The capacitor dielectric layer 178 may include, e.g., zirconium oxynitride, aluminum oxide, zirconium oxide, tantalum oxide, and/or hafnium oxide, etc., and may be formed using, e.g., an ALD process. The capacitor dielectric layer 178 may have a thickness of about 100 Angstroms to about 200 Angstroms.

The capacitor second electrode 180 may be formed on the capacitor dielectric layer 178. The capacitor second electrode 180 may include, e.g., TiN, Ti, TaN, Pt, etc.

The insulating layer 185 may be formed on the capacitor second electrode 180 in the cell region A and on the second etch stop layer 160 in the periphery region B. The insulating layer 185 may compensate for a difference in height between the cell region A and the periphery region B as a result of, e.g., the capacitors 175. The insulating layer 185 may be formed using, e.g., a TEOS and HDP process, and may be planarized using, e.g., CMP.

Referring back to FIG. 1, the insulating layer 185 may be patterned to expose portions, e.g., upper surfaces, of the third conductive patterns 165 in the periphery region B. Metal patterns 190 may be formed through the patterned insulating layer 185 and may be electrically connected, e.g., directly connected, to the respective third conductive patterns 165.

It should be understood that embodiments are not limited to the exemplary embodiment illustrated in FIGS. 1 through 19.

FIGS. 20A, 20B, 21A, 21B, 22A, 22B, 23A, 23B, 24A, and 24B illustrate an exemplary alternative to the stages illustrated in FIGS. 10A, 10B, 11A, and 11B. In general, only differences between the exemplary embodiment of FIGS. 20A through 24B and the exemplary embodiment of FIGS. 10A through 11B will be described below. Like reference terms correspond to like features of the exemplary embodiments.

Figure 20A:
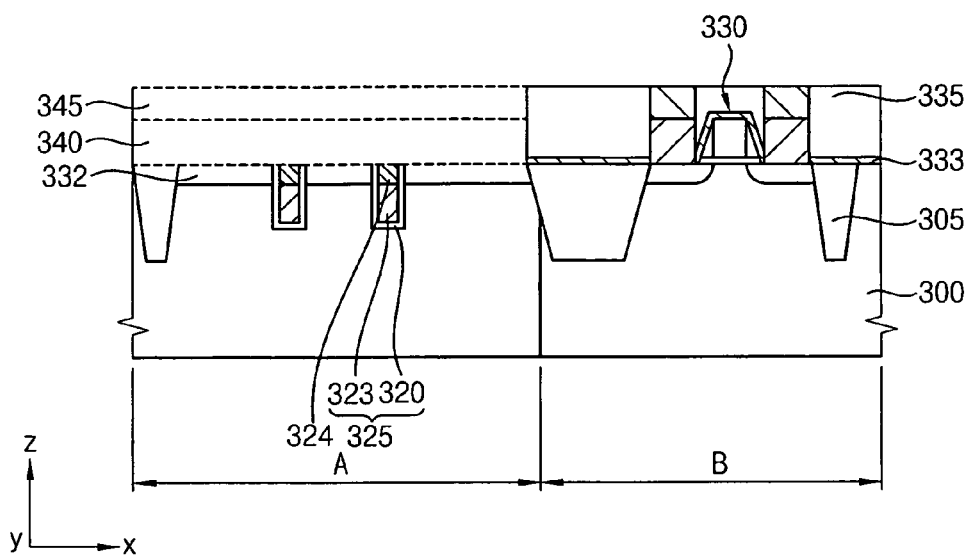
FIGS. 20A, 20B, 21A, 21B, 22A, 22B, 23A, 23B, 24A, and 24B illustrate an exemplary alternative to the stages illustrated in FIGS. 10A, 10B, 11A, and 11B.
Figure 20B:
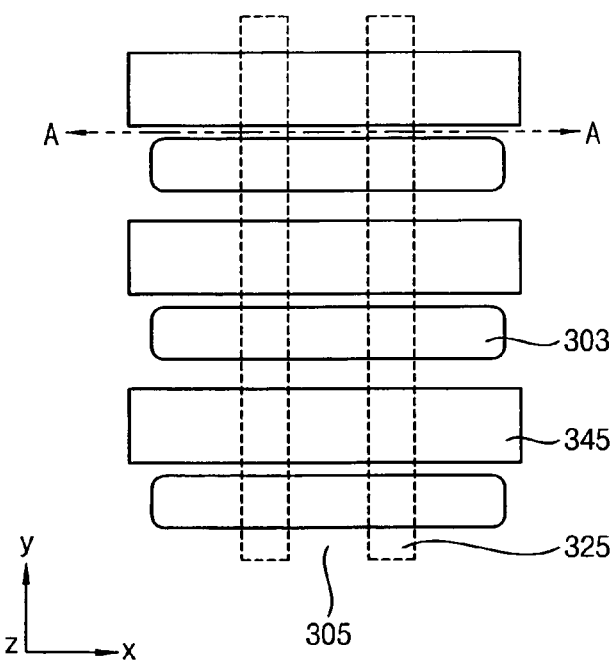
Figure 21A:
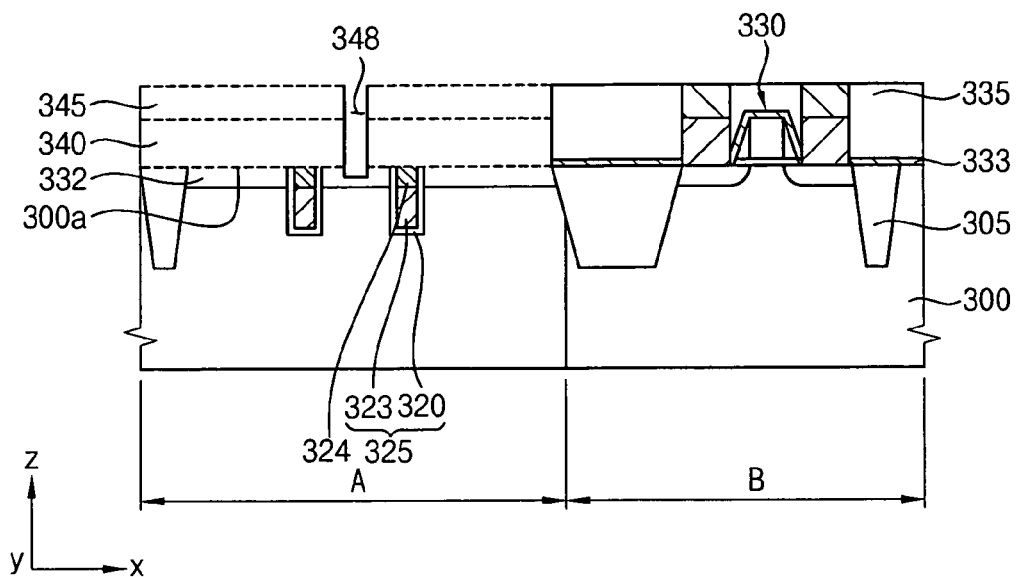

Referring to FIGS. 20A and 20B, in some embodiments, while a first conductive pattern 340 may be arranged directly on a semiconductor substrate 300, the first conductive pattern 340 may not itself directly overlap a respective active area 303. Referring to FIG. 20A, isolations 305 may be formed on the semiconductor substrate 300. A buried gate 325 including a gate insulating layer 320 and a gate electrode 323, a gate capping pattern 324, and source/drain regions 332 may be formed on the semiconductor substrate 300, e.g., in the cell region A. Still referring to FIG. 20A, a first etch stop layer 333 may be formed on the semiconductor substrate 300. A peripheral gate electrode 330 may be formed on the first etch stop layer 333 in the periphery region B. As shown in FIGS. 20A and 20B, the first conductive pattern 340 and a capping pattern 345 may be offset from the respective active area 303. In FIGS. 20A and 21A (discussed below), corresponding to cross-sectional lines A-A extending in a space between the respective active area 303 and the first conductive pattern 340, the first conductive pattern 340 and the capping pattern 345 are illustrated with dotted lines behind a first insulating interlayer 335.

Figure 21B:
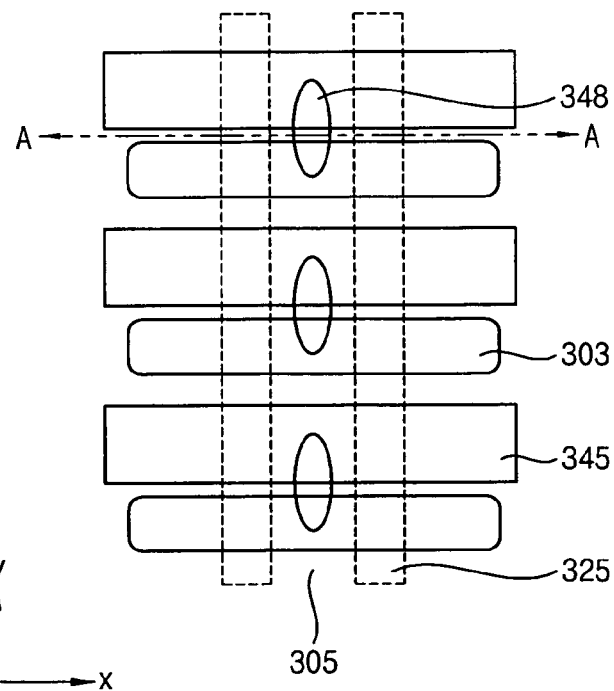
Figure 22A:
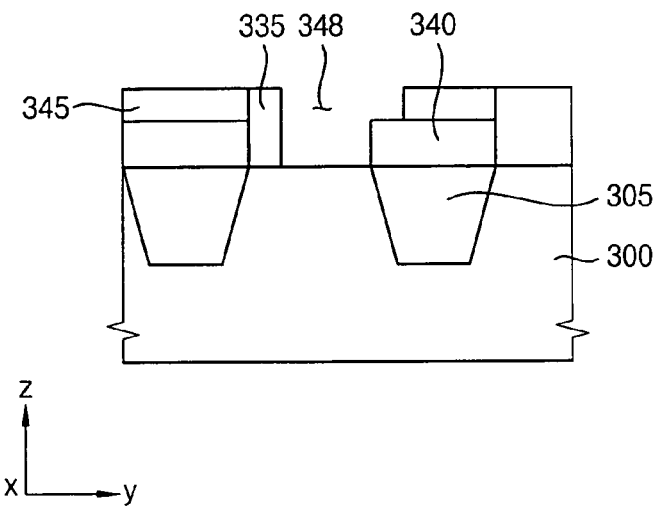
Figure 22B:
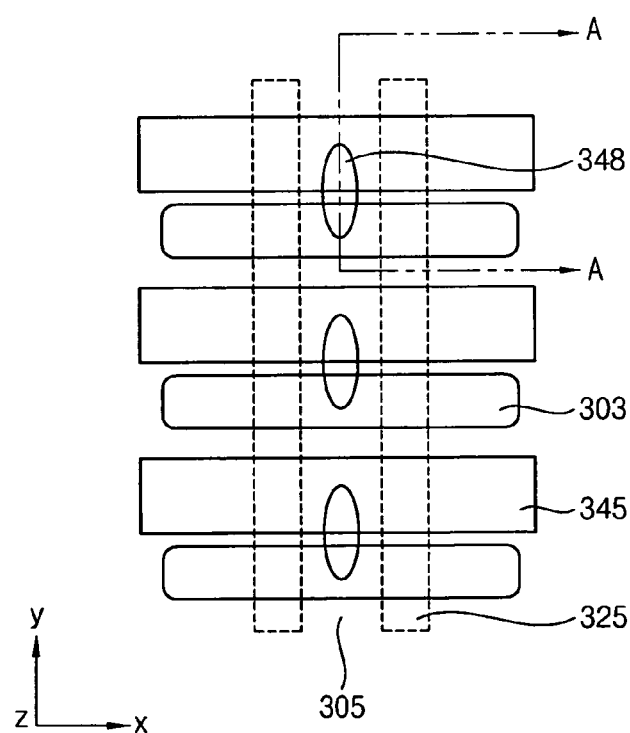
Figure 23A:
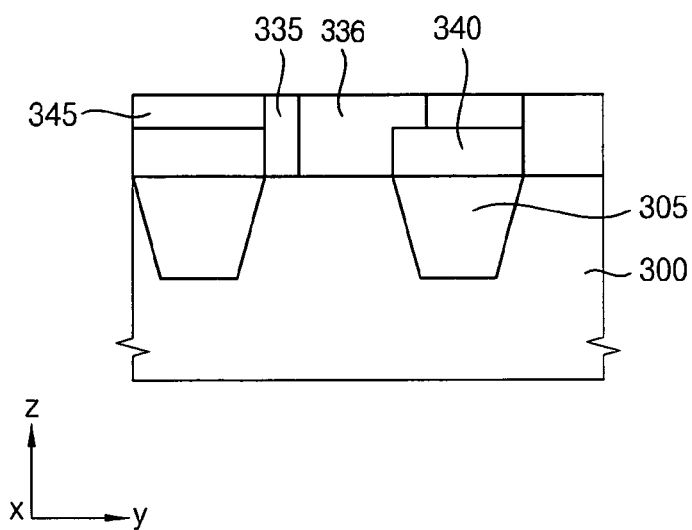
Figure 23B:
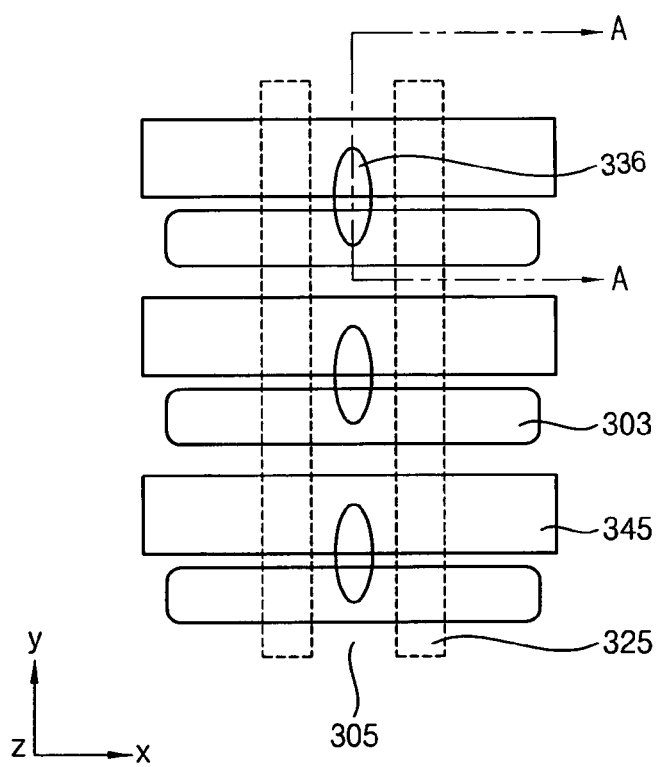
Figure 24A:
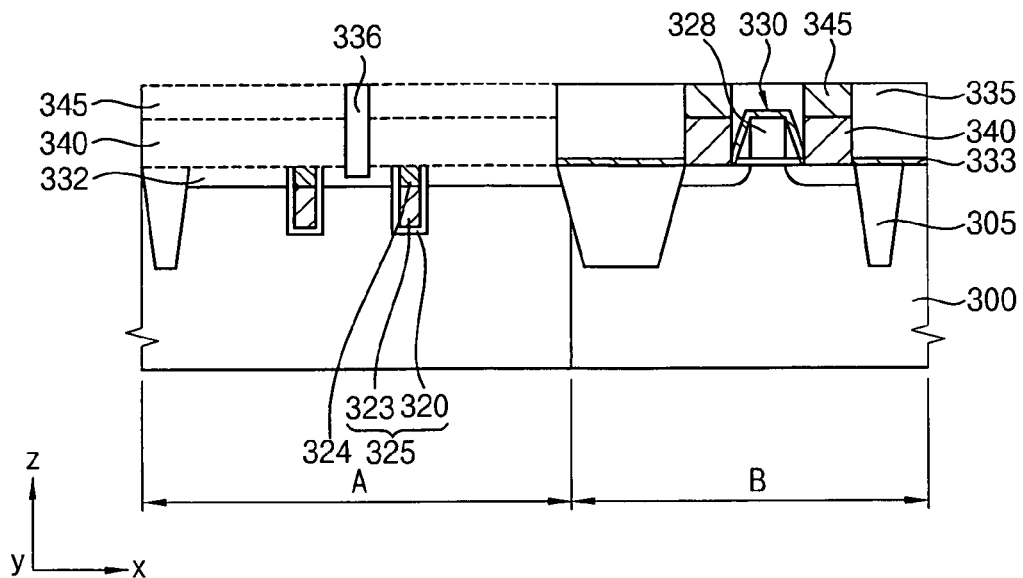
Figure 24B:
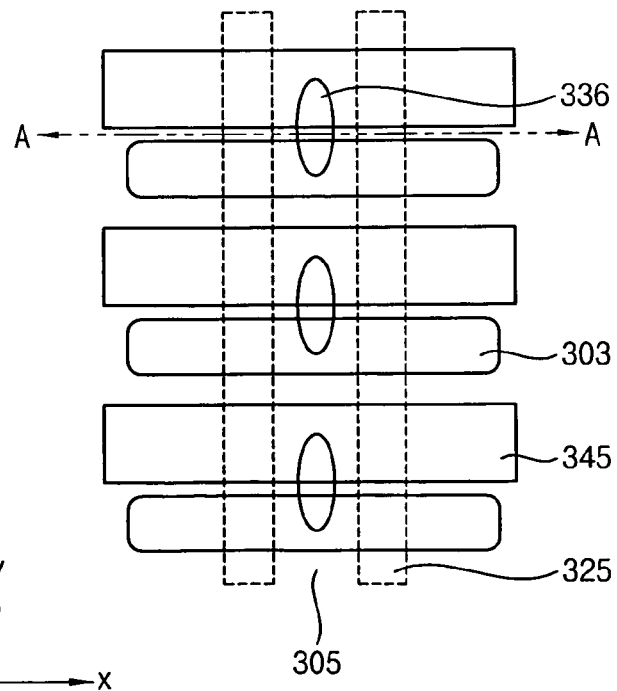

Referring to FIGS. 21A and 21B, as the first conductive pattern 340 does not directly overlap the respective active area 303, a recess 348 may be formed in the first insulating interlayer 335, the first conductive pattern 340 and/or the capping pattern 345 exposing a portion of the respective active area 303. The recesses 348 may protrude into respective the active area 303, i.e., below an upper surface 300a of the semiconductor substrate 300. Referring to FIGS. 22A and 22B, the recess 348 may include a stepped structure corresponding to exposed upper and side surfaces of the first conductive pattern 340. A portion of the first insulating interlayer 335 may electrically isolate respective portions of the first conductive pattern 340 and the capping pattern 345 from each other.

Figure 12A:
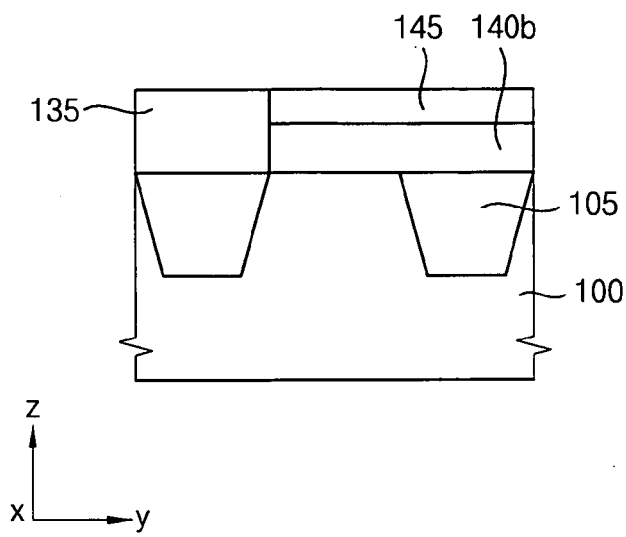
Figure 12B:
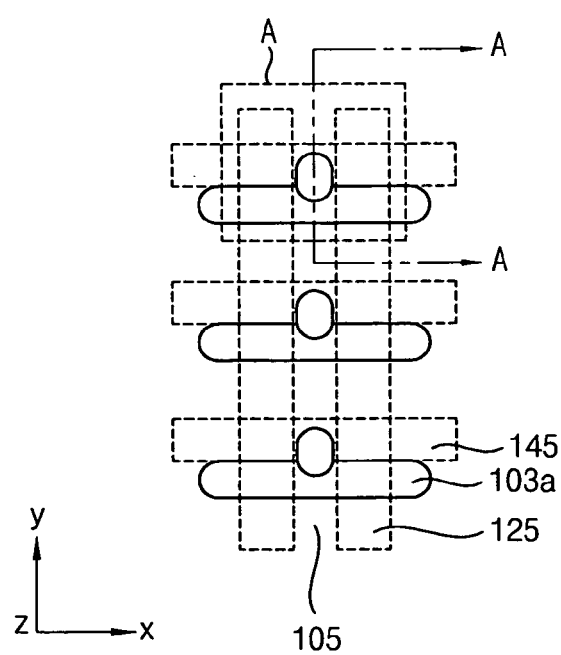

Referring to FIGS. 23A, 23B, 24A, and 24B, a cell conductive pattern 336 may be formed in the recess 348. The cell conductive pattern 336 may include, e.g., TiN, Ti/TiN, WN, W/WN, TaN, Ta/TaN, TiSiN, WSiN, and/or polysilicon, etc. In general, the method may then proceed as shown in FIGS. 12A and 12B.

As an exemplary alternative, e.g., in embodiments in which a material of the first conductive pattern 140 is a same as a material of the second gate electrode 328 of a peripheral gate electrode 330 (see FIG. 24A), the first conductive pattern 140 and the second gate electrode 328 may be formed during a same process, e.g., simultaneously. For example, both the second gate electrode 328 and the first conductive pattern 140 may include polysilicon. Further, e.g., in embodiments in embodiments including a cell conductive pattern 336, the cell conductive pattern 336 and a portion of the first conductive pattern 140 in the periphery region B, e.g., periphery region B direct connect, may be formed during a same process, e.g., simultaneously.

Figure 25:
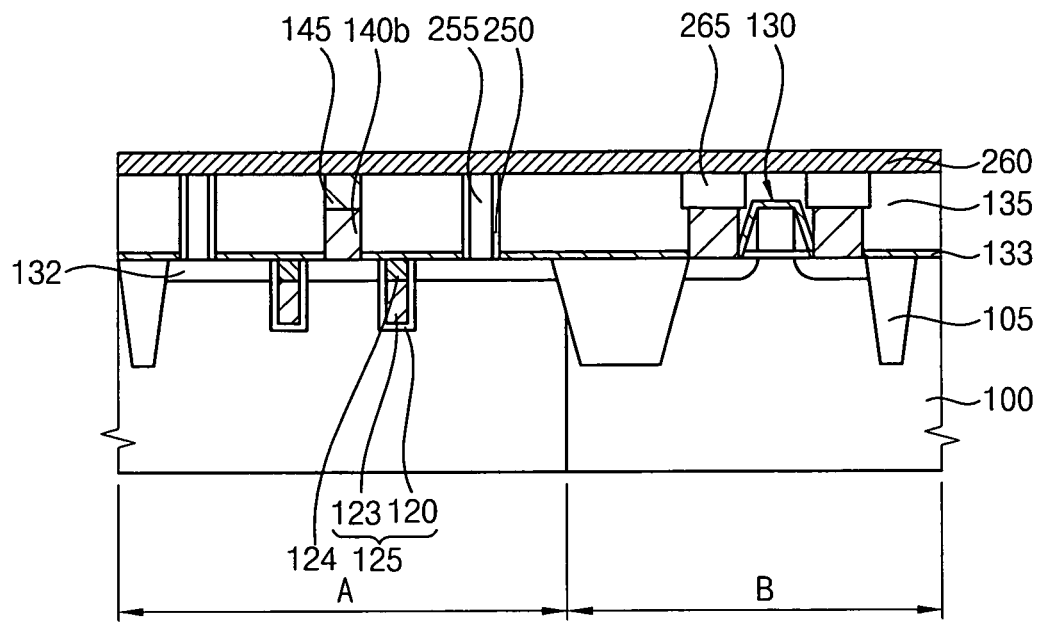
FIG. 25 illustrates an alternative embodiment of forming a second etch stop layer and a third conductive pattern in a periphery region.

As another exemplary alternative, in contrast to the exemplary stages illustrated in FIGS. 14A and 14B of the first exemplary embodiment, in some embodiments, as shown in FIG. 25, the capping pattern 145 (see FIG. 14A) in the periphery region B may be removed and a third conductive pattern 265 may be formed on the first conductive pattern 140b before a second etch stop layer 260 is formed on the first insulating interlayer 135.

Figure 26:
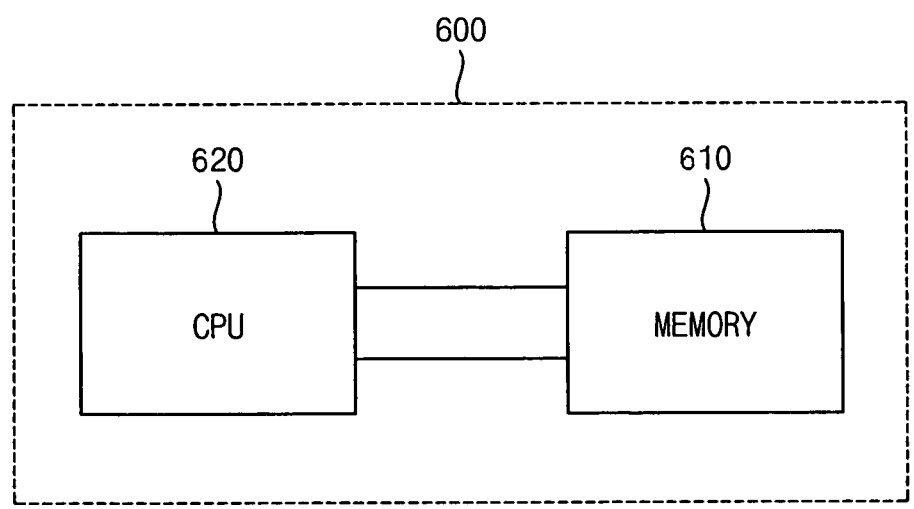
FIG. 26 illustrates a block diagram of an exemplary embodiment of a system employing the DRAM device of FIG. 1.

FIG. 26 illustrates a block diagram of an exemplary embodiment of a system 600 employing, e.g., the DRAM device 10 of FIG. 1. The system 600 may include a central processing unit (CPU) 620 and a memory 610. The memory 610 may correspond to the exemplary DRAM device 10 of FIG. 1. The system 600 may be, e.g., a flash memory system, etc. More particularly, the system 600 may be, e.g., a BCAT DRAM-flash memory system. The system 600 may be employed in, e.g., mobile systems such as a PDA, a portable computer, a web tablet, a wireless phone, a mobile phone, a digital music player, a memory card, and/or transmission/receiving systems, etc.

In the figures, the dimensions of layers and regions may be exaggerated for clarity of illustration. It will also be understood that when an element is referred to as being "on" another element, it can be directly on the other element, or intervening elements may also be present. In addition, it will also be understood that when an element is referred to as being "between" two elements, it may be the only element between the two elements, or one or more intervening elements may also be present. Additionally, it will be understood that when an element is referred to as being "between" two elements, it may be physically arranged between facing/overlapping portions of the two elements, it may be physically arranged such that one of the elements is below it and the other element is above it, or it may be such that it is along a path connecting the two elements. Like reference numerals refer to like elements throughout the specification.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

As used herein, the terms "a" and "an" are open terms that may be used in conjunction with singular items or with plural items.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
a semiconductor substrate including isolations thereon, the isolations defining active regions of the semiconductor substrate;
a plurality of buried gate electrodes extending below an upper surface of the semiconductor substrate; and
a plurality of bit lines each of which extends along a first direction on the semiconductor substrate including the isolations,
wherein:
each of the bit lines is connected to corresponding ones of the active regions of the semiconductor substrate without a conductive plug, and
a bottom surface of each of the bit lines directly contacts upper surfaces of the corresponding ones of the active regions to which the bit lines are connected and directly contacts upper surfaces of the isolations between the corresponding ones of the active regions.

2. The semiconductor device as claimed in claim 1, wherein at least a portion of the bit lines extend along a same plane as the upper surface of the corresponding ones of the active regions to which the bit lines are connected.

3. The semiconductor device as claimed in claim 1, wherein at least one of the bit lines and/or the active regions include protruding portions that protrude in a second direction crossing the first direction so as to directly overlap with and connect to corresponding other ones of the at least one of the active regions and/or bit lines, respectively, the second direction being parallel to same plane as the upper surface of the corresponding ones of the active regions.

4. The semiconductor device as claimed in claim 1, wherein the bit lines have a substantially and/or a completely line type pattern.

5. The semiconductor device as claimed in claim 1, further comprising:
a plurality of capacitors on the semiconductor substrate; and
a plurality of buried contacts electrically connecting corresponding ones of the active regions of the semiconductor substrate to a corresponding one of the capacitors.

6. The semiconductor device as claimed in claim 5, wherein the plurality of buried contacts are on a same and/or substantially same level as the bit lines relative to an upper surface of the semiconductor substrate.

7. The semiconductor device as claimed in claim 1, further comprising a capping layer extending over the bit lines.

8. The semiconductor device as claimed in claim 1, wherein the active regions are substantially arranged between adjacent ones of the bit lines.

9. The semiconductor device as claimed in claim 1, wherein the bit lines are formed directly on the semiconductor substrate.

10. A method of forming a semiconductor device, the method comprising:
forming isolations defining active regions of a semiconductor substrate;
forming a plurality of buried gate electrodes extending below an upper surface of the semiconductor substrate; and
forming a plurality of bit lines each of which extends along a first direction on the semiconductor substrate including the isolations such each of the bit lines is connected to corresponding ones of the active regions of the semiconductor substrate without a conductive plug, and a bottom surface of each of the bit lines directly contacts upper surfaces of corresponding ones of the active regions to which the bit lines are connected and upper surfaces of the isolations between the corresponding ones of the active regions.

11. The method of forming a semiconductor device as claimed in claim 10, wherein forming the bit lines includes forming the bit lines directly on the semiconductor substrate.

12. The method of forming a semiconductor device as claimed in claim 10, wherein forming the plurality of bit lines and forming the active regions includes patterning one of the bit lines and the active regions to include protruding portions that protrude in a second direction crossing the first direction so as to directly overlap with and connect to the other corresponding one of the active regions and bit lines, respectively.

13. The method of forming a semiconductor device as claimed in claim 10, the semiconductor device including a cell region and a peripheral region, the method further including forming a peripheral gate electrode in the peripheral region, wherein forming the bit lines and forming the peripheral gate electrode occur simultaneously.

14. The method of forming a semiconductor device as claimed in claim 10, further comprising:
forming a plurality of buried contacts on the semiconductor substrate; and
forming a plurality of capacitor structures on the semiconductor substrate, the buried contacts electrically connecting corresponding ones of the active regions of the semiconductor substrate to a corresponding one of the capacitor structures.

15. The method of forming a semiconductor device as claimed in claim 14, wherein forming the buried contacts includes forming the buried contacts such that the plurality of buried contacts are on a same and/or substantially same level as the bit lines relative to an upper surface of the semiconductor substrate.

16. The method of forming a semiconductor device as claimed in claim 10, further comprising forming a capping layer extending over the bit lines.

17. The method of forming a semiconductor device as claimed claim 10, the semiconductor device including a cell region and a peripheral region, the method further including simultaneously forming a peripheral gate electrode on the peripheral region while forming the bit lines on the cell region.

18. A system, comprising:
a controller; and
a memory device, the memory device including:
a semiconductor substrate including isolations thereon, the isolations defining active regions of the semiconductor substrate;
a plurality of buried gate electrodes extending below an upper surface of the semiconductor substrate; and
a plurality of bit lines each of which extends along a first direction on the semiconductor substrate including the isolations,
wherein:
each of the bit lines is connected to corresponding ones of the active regions of the semiconductor substrate without a conductive plug,
a bottom surface of each of the bit lines directly contacts upper surfaces of the corresponding ones of the active regions to which the bit lines are connected and upper surfaces of the isolations between the corresponding ones of the active regions, and
the controller is adapted to program data in and erase data from the memory device.

19. The system as claimed in claim 18, wherein the memory device is a DRAM flash memory.

20. A semiconductor device, comprising:
a semiconductor substrate including isolations defining active regions of the semiconductor substrate;
a plurality of buried gate electrodes extending below an upper surface of the semiconductor substrate; and
a plurality of bit lines extending along a first direction over the semiconductor substrate, the bit lines extending beyond a plurality of the active regions in the first direction,
wherein:
the plurality of bit lines are connected to corresponding ones of the active regions of the semiconductor substrate without a conductive plug, and
a bottom surface of the bit lines extending beyond the plurality of the active regions in the first direction extend along a same and/or substantially same plane as an upper surface of the corresponding ones of the active regions to which the bit lines are connected.

21. The semiconductor device as claimed in claim 20, wherein at least a portion of the bit lines extend along a same plane as the upper surface of the corresponding ones of the active regions to which the bit lines are connected.

22. The semiconductor device as claimed in claim 20, wherein at least one of the bit lines and/or the active regions include protruding portions that protrude in a second direction crossing the first direction so as to directly overlap with and connect to corresponding other ones of the at least one of the active regions and/or bit lines, respectively, the second direction being parallel to same plane as the upper surface of the corresponding ones of the active regions.

* * * * *